US012690293B2

(12) United States Patent
Kim et al.

(10) Patent No.: US 12,690,293 B2
(45) Date of Patent: Jul. 21, 2026

(54) SELF-ASSEMBLY DEVICE AND SELF-ASSEMBLY METHOD

(71) Applicant: LG ELECTRONICS INC., Seoul (KR)

(72) Inventors: Jinsung Kim, Seoul (KR); Sungyun Park, Seoul (KR); Seongmin Moon, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 277 days.

(21) Appl. No.: 18/271,395

(22) PCT Filed: Jan. 8, 2021

(86) PCT No.: PCT/KR2021/000247
§ 371 (c)(1),
(2) Date: Jul. 7, 2023

(87) PCT Pub. No.: WO2022/149633
PCT Pub. Date: Jul. 14, 2022

(65) Prior Publication Data
US 2024/0063327 A1      Feb. 22, 2024

(51) Int. Cl.
H10H 20/01      (2025.01)
H10H 29/14      (2025.01)
(52) U.S. Cl.
CPC .......... H10H 20/01 (2025.01); H10H 29/142 (2025.01)

(58) Field of Classification Search
CPC ...... H10H 20/01; H10H 29/142; H10P 72/00; H10P 72/74; H10W 90/00; H10W 72/0198
See application file for complete search history.

(56) References Cited

U.S. PATENT DOCUMENTS

| | | | |
|---|---|---|---|
| 2006/0048384 A1* | 3/2006 | Ricks ................... | H10W 40/10 257/E21.705 |
| 2006/0051517 A1* | 3/2006 | Haas ..................... | H10W 40/10 257/E21.705 |

(Continued)

FOREIGN PATENT DOCUMENTS

| | | |
|---|---|---|
| EP | 2 688 093 A1 | 1/2014 |
| JP | 2018-61017 A | 4/2018 |

(Continued)

OTHER PUBLICATIONS

Written Opinion of the International Searching Authority for PCT/KR2021/000247 (Year: 2021).*

(Continued)

*Primary Examiner* — Jeffrie R Lund
(74) *Attorney, Agent, or Firm* — Birch, Stewart, Kolasch & Birch, LLP

(57) ABSTRACT

A self-assembly device comprises a chamber configured to accommodate a fluid in which a plurality of light emitting devices are floated on a surface thereof, the fluid having a first height, a mounting part disposed on a bottom portion of the chamber to mount a substrate, a fluid level adjuster configured to adjust a height of the fluid, and a voltage supplier configured to apply a voltage to the substrate to assemble the floated plurality of light emitting devices when the height of the fluid decreases from the first height to a second height.

11 Claims, 20 Drawing Sheets

(56)  References Cited

U.S. PATENT DOCUMENTS

| | | | |
|---|---|---|---|
| 2006/0057293 | A1 | 3/2006 | Sharma et al. |
| 2007/0224713 | A1 | 9/2007 | Han et al. |
| 2008/0023435 | A1 | 1/2008 | Wu et al. |
| 2018/0102352 | A1 | 4/2018 | Sasaki et al. |
| 2021/0151633 | A1 | 5/2021 | Sasaki et al. |
| 2021/0272936 | A1 | 9/2021 | Kim et al. |
| 2022/0223437 | A1 | 7/2022 | Lee et al. |
| 2022/0278082 | A1 | 9/2022 | Kim et al. |
| 2022/0367423 | A1 | 11/2022 | Yang et al. |
| 2024/0063327 | A1* | 2/2024 | Kim ...................... H10H 20/01 |

FOREIGN PATENT DOCUMENTS

| | | | |
|---|---|---|---|
| KR | 10-2020-0000244 | A | 1/2020 |
| KR | 10-2020-0026669 | A | 3/2020 |
| KR | 10-2020-0026725 | A | 3/2020 |
| KR | 10-2190064 | B1 | 12/2020 |

OTHER PUBLICATIONS

International Search Report for PCT/KR2021/000247 mailed on Oct. 5, 2021.

* cited by examiner

FIG. 12

SELF-ASSEMBLY DEVICE AND SELF-ASSEMBLY METHOD

CROSS REFERENCE TO RELATED APPLICATION

This application is the National Phase of PCT International Application No. PCT/KR2021/000247, filed on Jan. 8, 2021, which is hereby expressly incorporated by reference into the present application.

TECHNICAL FIELD

The embodiment relates to a self-assembly device and a self-assembly method.

BACKGROUND ART

A display device displays a high-definition image by using a self-light emitting device such as a light emitting diode as a light source of a pixel. The light emitting diode has excellent durability, long lifespan, and high luminance even under harsh environmental conditions, and are in the limelight as a light source for next-generation display devices.

Recently, a super small-sized light emitting diode is manufactured using a material having a highly reliable inorganic crystal structure, and the super small-sized light emitting diode is disposed on a panel of a display device (hereinafter referred to as a "display panel") such that research is underway to use it as a next-generation pixel light source.

In order to implement high resolution, a size of pixel is gradually getting smaller, and a number of light emitting devices are arranged in the pixel of such a reduced size. Accordingly, research on the manufacture of super small-sized light emitting diode as small as micro or nano scale is being actively conducted.

Generally, a display panel includes millions of pixels. It is very difficult to align light emitting devices to each of millions of small-sized pixels. Accordingly, various studies on a method of aligning light emitting devices on a display panel have recently been actively conducted.

In general, in the light emitting device, the ohmic characteristics between the electrode and the semiconductor layer containing the n-type dopant are not good. Thus, an ohmic contact layer is formed between the semiconductor layer and the electrode. In general, the ohmic contact layer is formed by a reaction between a material of a semiconductor layer and a material of an electrode through a heat treatment process.

Meanwhile, as the size of light emitting devices decreases, transferring these light emitting devices onto a substrate has become a very important problem. Transfer technologies that have recently been developed include a pick and place process, a laser lift-off method, or a self-assembly method. In particular, a self-assembly method in which a light emitting device is transferred onto a substrate using a magnetic material (or magnet) has recently been in the spotlight.

In the self-assembly method among them, as shown in FIG. 1, a substrate 3 having wiring electrodes 4 and 5 is disposed parallel to a horizontal surface of the chamber (not shown). Thereafter, the light emitting devices 7 and 8 move along the moving direction of the magnet 1 located on the substrate 3 and are assembled in the corresponding assembly hole 2. The assembly hole 2 is located between wiring electrodes 4 and 5. The light emitting devices 7 and 8 are moved near the corresponding assembly hole 2 by the magnet 1 and the light emitting devices 7 and 8 are assembled into the corresponding assembly hole 2 by the dielectrophoretic force between the wiring electrodes 4 and 5.

Recently, as the demand for a large-size display increases, self-assembly on large-size substrates is required. When the substrate 3 of the $8^{th}$ generation (2200 mm×2500 mm) or higher is disposed parallel to the horizontal surface of the chamber, the substrate 3 is bent downward by gravity.

In this way, when the magnet 1 is moved along the horizontal direction while the substrate 3 is bent, the strength of the magnetic field by the magnet 1 near the assembly hole 2 of the substrate 3 varies according to the degree of bending of the substrate 3. For example, since the strength of the magnetic field by the magnet 1 near the assembly hole 2 located in the edge region of the substrate 1 is large, a relatively large number of light emitting devices 7 and 8 move along the magnet. However, since the strength of the magnetic field by the magnet 1 near the assembly hole 2 located in the central region of the substrate 1 is small, a relatively small number of light emitting devices move along the magnet 1 or no light emitting devices move along the magnet 1 at all. For example, since the light emitting device 7 near the edge of the substrate 1 where warpage does not occur is relatively close to the magnet 1, a large magnetic field strength is applied by the magnet 1. Thus, the corresponding light emitting device 7 can be easily assembled into a desired assembly hole 2 by moving along the magnet 1. On the other hand, since the light emitting device 8 near the center of the substrate 1 where the warpage occurs is relatively far from the magnet 1, a small magnetic field strength is applied by the magnet 1. Thus, since the light emitting device 7 does not move along the magnet 1 or moves slowly, it is not be assembled in the desired assembly hole 2 or it is difficult to assemble.

Therefore, there is a problem in that the luminance of each pixel is non-uniform because the number of self-assembled light emitting devices is different for each position of the substrate 1. In addition, there was a problem in that it was difficult to secure high luminance because the light emitting devices were not assembled pixel by pixel as desired.

In addition, as the size of the light emitting device 8 decreases, the light emitting device 8 is delayed in being attracted to the magnet 1. Thus, there is a problem in that the self-assembly speed is reduced.

In addition, since the desired number of light emitting devices 8 are not induced by the magnet 1 in moving, the desired number of light emitting devices 8 cannot be assembled to each pixel. Accordingly, there is a problem in that the luminance of each pixel is significantly lowered.

DISCLOSURE

Technical Problem

An object of the embodiment is to solve the foregoing and other problems.

Another object of the embodiment is to provide a self-assembly device and a self-assembly method capable of securing uniform luminance for each pixel.

Another object of the embodiment is to provide a self-assembly device and a self-assembly method capable of securing high luminance.

Another object of the embodiment is to provide a self-assembly device and a self-assembly method capable of improving assembly accuracy and self-assembly speed.

Another object of the embodiment is to provide a self-assembly device and a self-assembly method capable of increasing the recovery rate of light emitting devices.

Technical Solution

According to one aspect of the embodiment to achieve the above or other object, a self-assembly device, comprising: a chamber configured to accommodate a fluid in which a plurality of light emitting devices are floated on a surface thereof, the fluid having a first height; a mounting part disposed on a bottom portion of the chamber to mount a substrate; a fluid level adjuster configured to adjust a height of the fluid; and a voltage supplier configured to apply a voltage to the substrate to assemble the floated plurality of light emitting devices when the height of the fluid decreases from the first height to a second height.

According to another aspect of the embodiment, a self-assembly method, comprising: mounting a substrate on a bottom portion of a chamber; accommodating a fluid having a first height in the chamber; floating a plurality of light emitting devices by dropping the plurality of light emitting devices in the fluid; reducing a height of the fluid from the first height to a second height; and assembling the plurality of floating light emitting devices on the substrate by applying a voltage to the substrate.

Advantageous Effects

The effect of the self-assembly device and the self-assembly method according to the embodiment is described as follows.

According to at least one of the embodiments, it is possible to secure uniform luminance for each pixel and secure high luminance.

As shown in FIGS. 10 and 11, since one surface of the light emitting device 150 has a hydrophobic-treated surface 157, when the plurality of light emitting devices 10 are dropped in the fluid 415, the hydrophobic-treated surface 157 of the light emitting device 150 can be positioned to face upward due to the assembly directionality of the light emitting device 150. When the self-assembly is performed in the arrangement state of the light emitting device 150 as described above, the light emitting device 150 can be assembled into the assembly hole 300 of the substrate 200 without defects. Accordingly, luminance can be remarkably improved by increasing the number of normal light emitting devices in each pixel of the substrate 200. In addition, when self-assembly is performed in the arrangement state of the light emitting device 150 as described above, the light emitting device 150 is accurately assembled into the assembly hole 203 of the substrate 200, thereby improving assembly accuracy and assembly speed.

As shown in FIGS. 10 and 14, a mounting part 420 can be provided in a lower side of the chamber 410, and the mounting part 420 can comprise a fixing groove 423 having a flat bottom portion 421. When the substrate 200 is mounted on the bottom portion 421 of the fixing groove 423 of the mounting part 420, warpage does not occur in the substrate 200. Accordingly, since the plurality of light emitting devices 150 floating on the surface 416 of the plurality of fluids 415 are spaced at the same distance from the assembly surface 207 of the substrate 200, the plurality of light emitting devices 150 can be evenly assembled to each pixel.

Accordingly, it is possible to secure uniform luminance for each pixel. Further, as shown in FIG. 20, the plurality of light emitting devices 150 can float on a surface 416 of the fluid 415 near the assembly surface 207 of the substrate 200. Accordingly, during self-assembly, the plurality of light emitting devices can be assembled into the assembly hole 203 of the substrate 200 positioned right below so that uniform luminance can be secured for each pixel. In addition, the plurality of light emitting devices 150 can be positioned near the assembly surface 207 of the substrate 200. Accordingly, during self-assembly, the probability of being assembled in the assembly hole 203 of the substrate 200 is higher so that high luminance can be secured.

According to at least one of the embodiments, assembly accuracy and self-assembly speed can be improved.

As shown in FIG. 20, the plurality of light emitting devices 150 can be positioned near the assembly surface 207 of the substrate 200. Accordingly, during self-assembly, the light emitting device 150 can be assembled into the assembly hole 203 of the substrate 200 located below the corresponding light emitting device 150 by the dielectrophoretic force formed in the substrate 200, thereby improving assembly accuracy and self-assembly speed.

According to at least one of the embodiments, the recovery rate of the light emitting device can be increased.

As shown in FIG. 20, the light emitting device 150 that is not assembled on the substrate 200 can be recovered using the recovery device 480, thereby increasing the recovery rate of the light emitting device.

In addition, the defective light emitting device can be detached from the substrate 200 by using the vibration of the vibration generator 490. The defective light emitting device can be a light emitting device that is not inserted into the assembly hole 203 of the substrate 200 and is attached near the assembly hole 203 of the substrate 200 or inserted into the assembly hole 203 in the wrong direction. The defective light emitting devices detached from the substrate 200 can return to the surface of the fluid 415 and can be recovered by the recovery device 480. Accordingly, not only the recovery rate is increased, but also the manufacturing cost can be significantly reduced.

A further scope of applicability of the embodiment will become apparent from the detailed description that follows. However, since various changes and modifications within the spirit and scope of the embodiment can be clearly understood by those skilled in the art, it should be understood that the detailed description and specific embodiment, such as preferred embodiment, are given by way of example only.

DESCRIPTION OF DRAWINGS

FIG. 12 is a cross-sectional view showing a state in which the light emitting device of the embodiment floats on a surface of a fluid.

MODE FOR INVENTION

Figure 1:
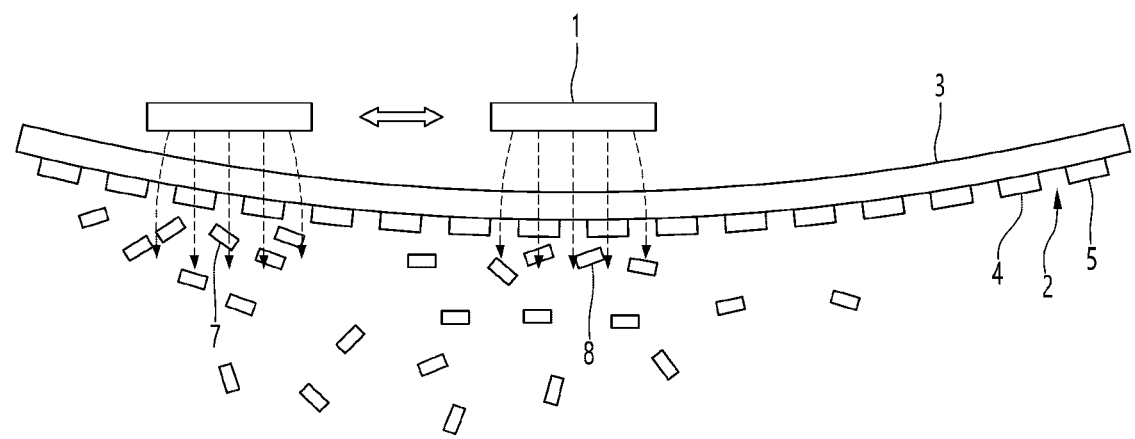
FIG. 1 shows a typical self-assembly process.

Hereinafter, the embodiment disclosed in this specification will be described in detail with reference to the accompanying drawings, but the same or similar elements are given the same reference numerals regardless of reference numerals, and redundant descriptions thereof will be omitted. The suffixes 'module' and 'unit' for the elements used in the following descriptions are given or used interchangeably in consideration of ease of writing the specification, and do not themselves have a meaning or role that is distinct from each other. In addition, the accompanying drawings are for easy understanding of the embodiment disclosed in this specification, and the technical idea disclosed in this specification is not limited by the accompanying drawings. Also, when an element such as a layer, region or substrate is referred to as being 'on' another element, this means that there can be directly on the other element or be other intermediate elements therebetween.

The display devices described in this specification can comprise a mobile phone, a smart phone, a laptop computer, a terminal for digital broadcasting, a personal digital assistant (PDA), a portable multimedia player (PMP), a navigation device, a slate PC, a tablet PC, an ultra-Book, a digital TV, a desktop computer, etc. However, the configuration according to the embodiment described in this specification can be applied to a display-capable device even if it is a new product type to be developed in the future.

Hereinafter, a light emitting device according to an embodiment and a display device comprising the light emitting device will be described.

Figure 2:
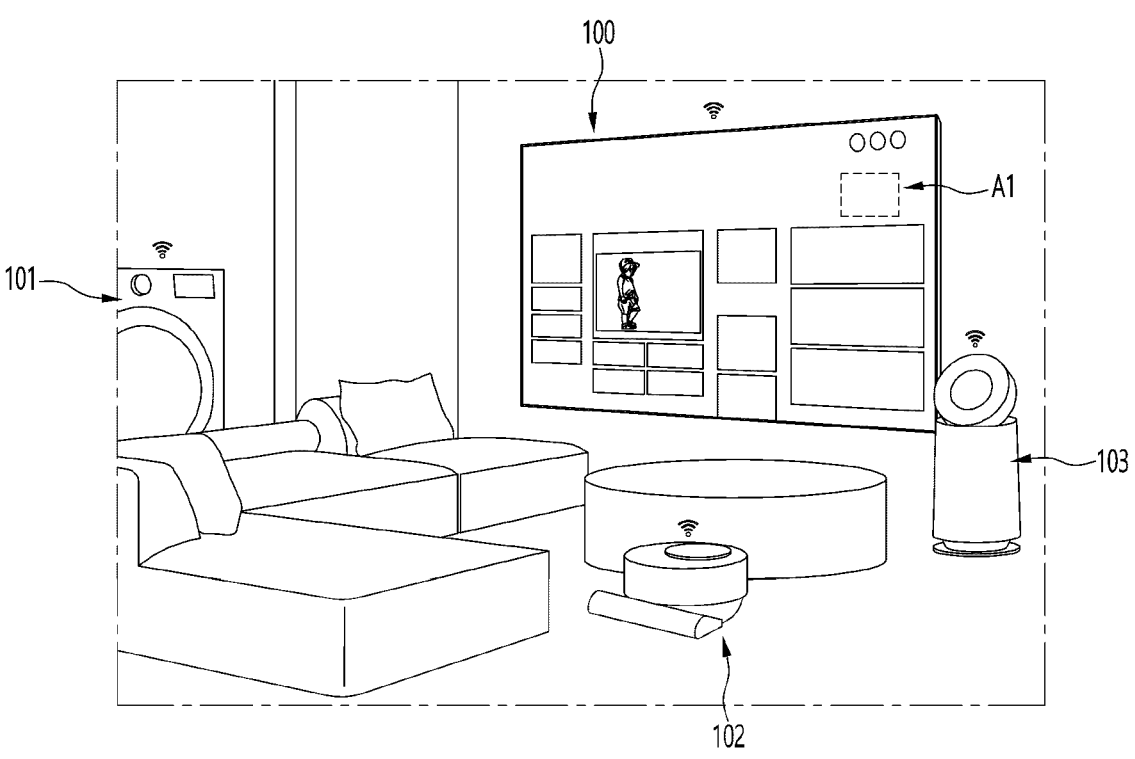
FIG. 2 illustrates a living room of a house in which a display device 100 according to an embodiment is disposed.

FIG. 2 illustrates a living room of a house in which a display device 100 according to an embodiment is disposed.

The display device 100 of the embodiment can display the status of various electronic products such as a washing machine 101, a robot cleaner 102, and an air purifier 103, communicate with each electronic product based on IOT and control each electronic product based on user's setting data.

The display device 100 according to the embodiment can comprise a flexible display manufactured on a thin and flexible substrate. The flexible display can be bent or rolled like paper while maintaining the characteristics of an existing flat panel display.

In the flexible display, visual information can be implemented by independently controlling light emission of a unit pixel arranged in a matrix form. The unit pixel means a minimum unit for implementing one color. The unit pixel of the flexible display can be implemented by a light emitting device. In the embodiment, the light emitting device can be Micro-LED or Nano-LED, but is not limited thereto.

Figure 3:
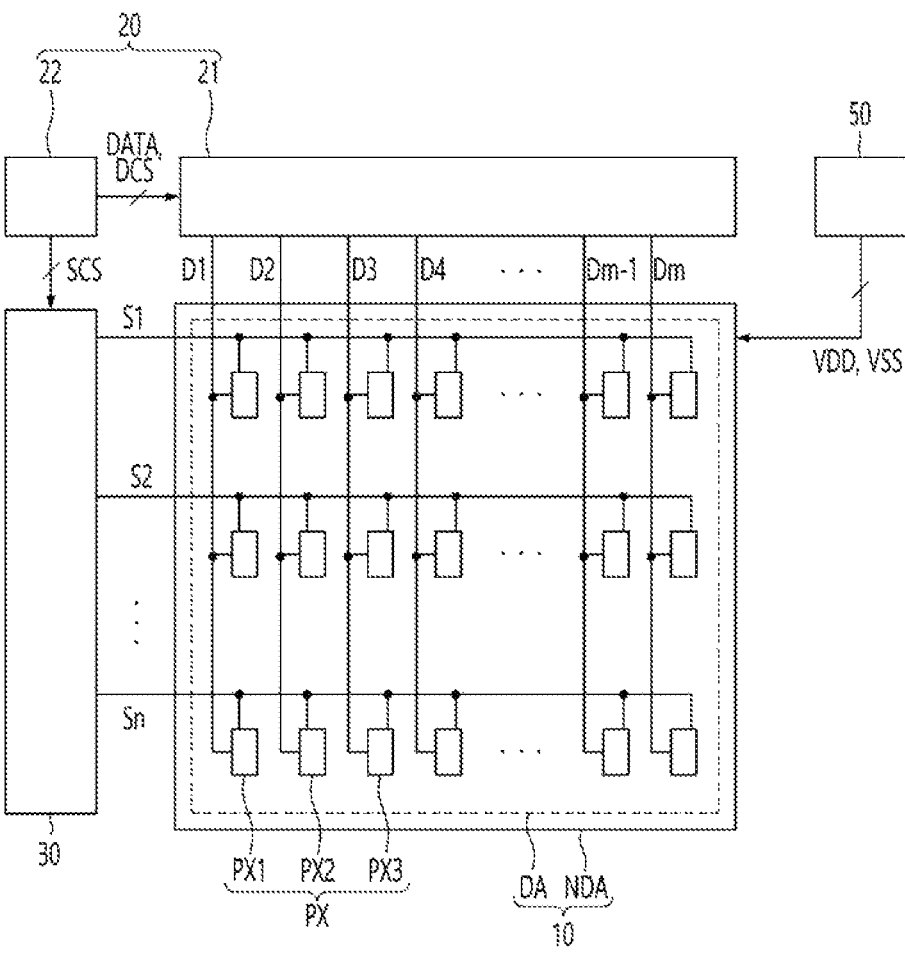
FIG. 3 is a schematic block diagram of a display device according to an embodiment.
Figure 4:
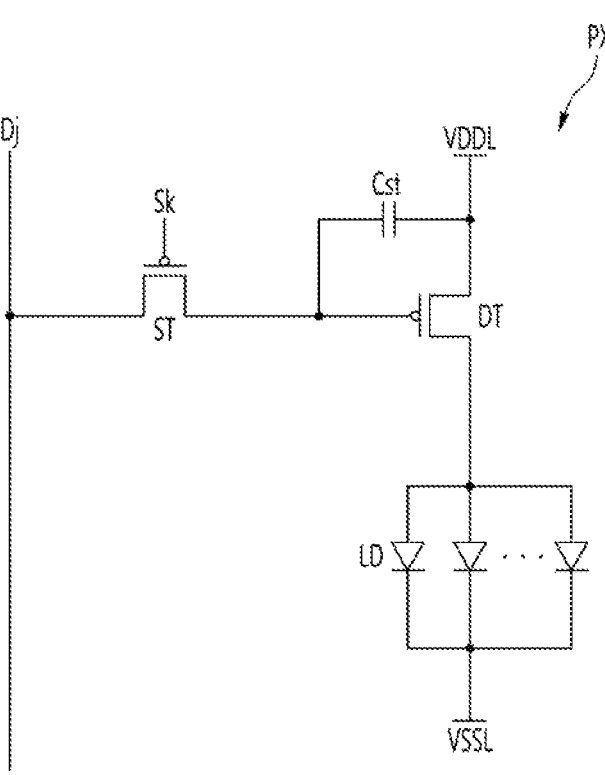
FIG. 4 is a circuit diagram showing an example of a pixel of FIG. 3.

FIG. 3 is a schematic block diagram of a display device according to an embodiment, and FIG. 4 is a circuit diagram showing an example of a pixel of FIG. 3.

Referring to FIG. 3 and FIG. 4, the display device according to the embodiment can comprise a display panel 10, a driving circuit 20, a scan driving circuit 30 and a power supply circuit 50.

The display device 100 of the embodiment can drive a light emitting device in an active matrix (AM) scheme or a passive matrix (PM) scheme.

The driving circuit 20 can comprise a data driving circuit 21 and a timing controller 22.

The display panel 10 can have a rectangular shape, but is not limited thereto. That is, the display panel 10 can be formed in a circular or elliptical shape. At least one side of the display panel 10 can be formed to be bent with a predetermined curvature.

The display panel 10 can be divided into a display area DA and a non-display area NDA disposed around the display area DA. The display area DA is an area where the pixels PX are formed to display an image. The display panel 10 can comprise data lines (D1 to Dm, where m is an integer greater than or equal to 2), scan lines (S1 to Sn, where n is an integer greater than or equal to 2) crossing the data lines (D1 to Dm), a high potential voltage line VDDL supplied with a high potential voltage, a low potential voltage line VSSL supplied with a low potential voltage, and pixels PX connected to the data lines D1 to Dm and the scan lines S1 to Sn.

Each of the pixels PX can comprise a first sub-pixel PX1, a second sub-pixel PX2, and a third sub-pixel PX3. The first sub-pixel PX1 can emit a first color light with a first main wavelength, the second sub-pixel PX2 can emit of a second color light with a second main wavelength, and the third sub-pixel PX3 can emit a third color light with a third main wavelength. The first color light can be red light, the second color light can be green light, and the third color light can be blue light, but are not limited thereto. In addition, in FIG. 3, it is illustrated that each of the pixels PX comprise three sub-pixels, but are not limited thereto. That is, each of the pixels PX can comprise four or more sub-pixels.

Each of the first sub-pixel PX1, the second sub-pixel PX2, and the third sub-pixel PX3 can be connected to at least one of the data lines D1 to Dm, at least one of the scan lines S1 to Sn, and a high potential voltage line VDDL. As shown in FIG. 4, the first sub-pixel PX1 can comprise light emitting devices LDs, a plurality of transistors for supplying current to the light emitting devices LDs, and at least one capacitor Cst.

Each of the light emitting devices LD can be a semiconductor light emitting diode comprising a first electrode, a plurality of conductive semiconductor layers, and a second electrode. Here, the first electrode can be an anode electrode, and the second electrode can be a cathode electrode, but is not limited thereto.

The plurality of transistors can comprise a driving transistor DT supplying current to the light emitting devices LD and a scan transistor ST supplying a data voltage to a gate electrode of the driving transistor DT, as shown in FIG. 4. The driving transistor DT has a gate electrode connected to the source electrode of the scan transistor ST, a source electrode connected to the high potential voltage line VDDL to which a high potential voltage is applied, and a drain electrode connected to the first electrodes of the light emitting devices LD. The scan transistor ST has a gate electrode connected to the scan line (Sk, k is an integer that satisfies 1≤k≤n), a source electrode connected to the gate electrode of the driving transistor DT, and a drain electrode connected to the data lines (Dj, j an integer that satisfies $1 \leq j \leq m$).

The capacitor Cst is formed between the gate electrode and the source electrode of the driving transistor DT. The storage capacitor Cst stores a difference voltage between a gate voltage and a source voltage of the driving transistor DT.

The driving transistor DT and the scan transistor ST can be formed of a thin film transistor. In addition, in FIG. 4, the driving transistor DT and the scan transistor ST have been mainly described as being formed of P-type MOSFETs (Metal Oxide Semiconductor Field Effect Transistors), but are not limited thereto. The driving transistor DT and the scan transistor ST can be formed of N-type MOSFETs. In this case, positions of the source electrode and the drain electrode of each of the driving transistor DT and the scan transistor ST can be changed.

In addition, in FIG. 4, it is illustrated that each of the first sub-pixel PX1, the second sub-pixel PX2, and the third sub-pixel PX3 can comprise 2T1C (2 Transistor-1 capacitor) having one driving transistor DT, one scan transistor ST, and one capacitor Cst, but is not limited thereto. Each of the first sub-pixel PX1, the second sub-pixel PX2, and the third sub-pixel PX3 can comprise a plurality of scan transistors ST and a plurality of capacitors Cst.

Since the second sub-pixel PX2 and the third sub-pixel PX3 can be expressed with substantially the same circuit diagram as the first sub-pixel PX1, detailed descriptions will be omitted.

The driving circuit 20 outputs signals and voltages for driving the display panel 10. To this end, the driving circuit 20 can comprise a data driving circuit 21 and a timing controller 22.

The data driving circuit 21 receives digital video data DATA and a source control signal DCS from the timing controller 22. The data driving circuit 21 converts the digital video data DATA into analog data voltages according to the source control signal DCS and supplies them to the data lines D1 to Dm of the display panel 10.

The timing controller 22 receives digital video data DATA and timing signals from a host system. The timing signals can comprise a vertical synchronization signal, a horizontal synchronization signal, a data enable signal, and a dot clock. The host system can be an application processor of a smart phone or tablet PC, a system on chip of a monitor or TV, or the like.

The timing controller 22 generates control signals for controlling operation timings of the data driving circuit 21 and the scan driving circuit 30. The control signals can comprise a source control signal DCS for controlling the operation timing of the data driving circuit 21 and a scan control signal SCS for controlling the operation timing of the scan driving circuit 30.

The driving circuit 20 can be disposed in the non-display area NDA provided on one side of the display panel 10. The driving circuit 20 can be formed of an integrated circuit (IC) and mounted on the display panel 10 using a chip on glass (COG) scheme, a chip on plastic (COP) scheme, or an ultrasonic bonding scheme, but is not limited thereto. For example, the driving circuit 20 can be mounted on a circuit board (not shown) instead of the display panel 10.

The data driving circuit 21 can be mounted on the display panel 10 using a chip on glass (COG) scheme, a chip on plastic (COP) scheme, or an ultrasonic bonding scheme, and the timing controller 22 can be mounted on a circuit board.

The scan driving circuit 30 receives the scan control signal SCS from the timing controller 22. The scan driving circuit 30 generates scan signals according to the scan control signal SCS and supplies them to the scan lines S1 to Sn of the display panel 10. The scan driving circuit 30 can comprise a plurality of transistors and be formed in the non-display area NDA of the display panel 10. Alternatively, the scan driving circuit 30 can be formed as an integrated circuit, and in this case, it can be mounted on a gate flexible film attached to the other side of the display panel 10.

The circuit board can be attached to pads provided on one edge of the display panel 10 using an anisotropic conductive film. For this reason, the lead lines of the circuit board can be electrically connected to the pads. The circuit board can be a flexible printed circuit board, a printed circuit board, or a flexible film such as a chip on film. The circuit board can be bent to a lower side of the display panel 10. Accordingly, one side of the circuit board can be attached to one edge of the display panel 10 and the other side can be disposed below the display panel 10 and can be connected to a system board on which a host system is mounted.

The power supply circuit 50 can generate voltages necessary for driving the display panel 10 from the main power supplied from the system board and supply the voltages to the display panel 10. For example, the power supply circuit 50 generates a high potential voltage VDD and a low potential voltage VSS for driving the light emitting devices LD of the display panel 10 from the main power supply to supply them to the high potential voltage line VDDL and the low potential voltage line VSSL. Also, the power supply circuit 50 can generate and supply driving voltages for driving the driving circuit 20 and the scan driving circuit 30 from the main power.

Figure 5:
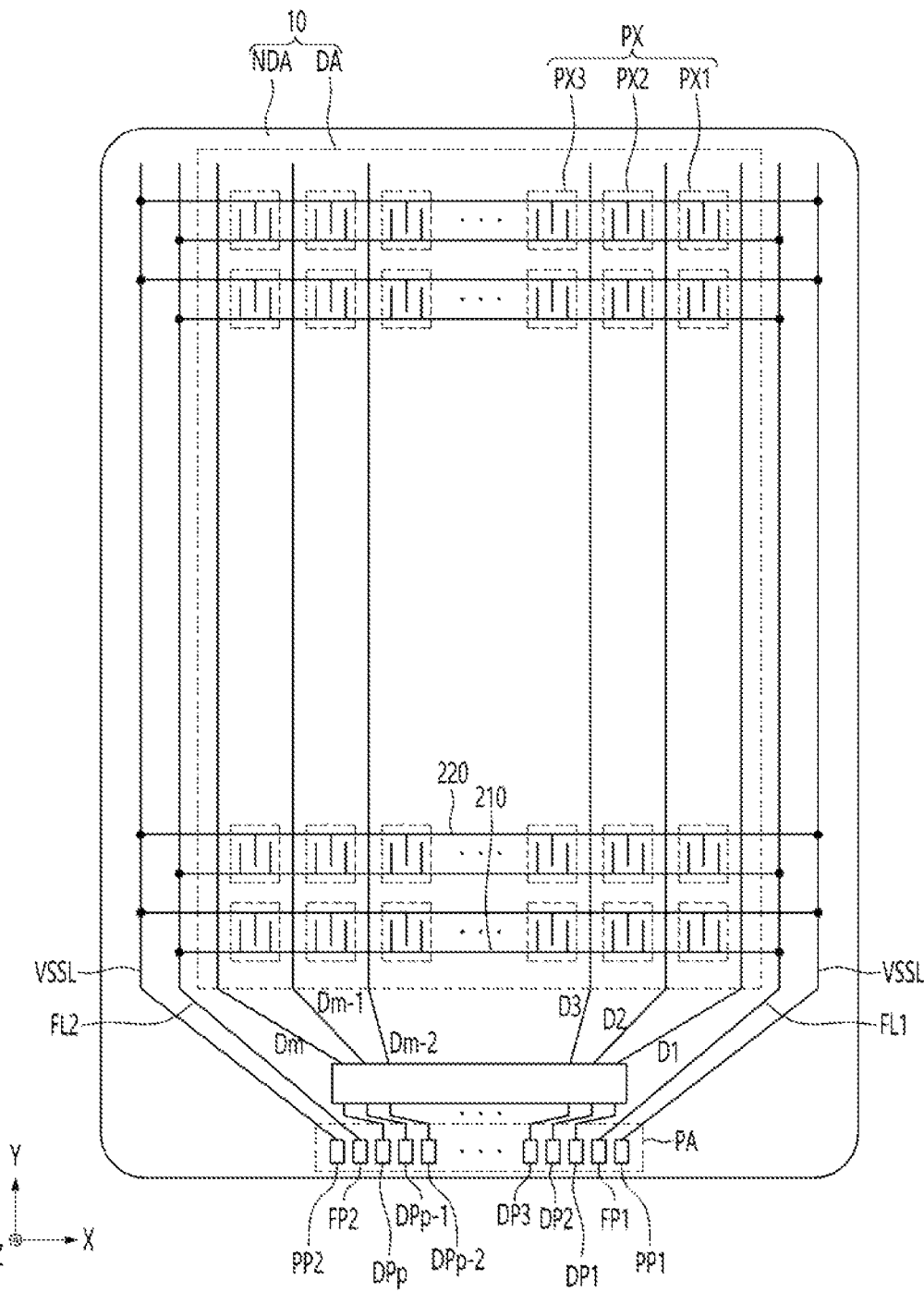
FIG. 5 is a plan view showing the display panel of FIG. 3 in detail.

FIG. 5 is a plan view showing the display panel of FIG. 3 in detail. In FIG. 5, for convenience of description, data pads (DP1 to DP$_p$, where p is an integer greater than or equal to 2), floating pads FD1 and FD2, power pads PP1 and PP2, floating lines FL1 and FL2, low potential voltage line VSSL, data lines D1 to Dm, first electrodes 210 and second electrodes 220 are shown.

Referring to FIG. 5, the data lines D1 to Dm, the first electrodes 210, the second electrodes 220, and the pixels PX can be disposed in the display area DA of the display panel 10.

The data lines D1 to Dm can extend long in the second direction (Y-axis direction). One sides of the data lines D1 to Dm can be connected to the driving circuit 20. For this reason, the data voltages of the driving circuit 20 can be applied to the data lines D1 to Dm.

The first electrodes 210 can be spaced apart from each other at predetermined intervals in the first direction (X-axis direction). For this reason, the first electrodes 210 may not overlap the data lines D1 to Dm. Among the first electrodes 210, the first electrodes 210 disposed on the right edge of the display area DA can be connected to the first floating line FL1 in the non-display area NDA. Among the first electrodes 210, the first electrodes 210 disposed at the left edge of the display area DA can be connected to the second floating line FL2 in the non-display area NDA.

Each of the second electrodes 220 can extend long in the first direction (X-axis direction). For this reason, the second electrodes 220 can overlap the data lines D1 to Dm. Also, the second electrodes 220 can be connected to the low potential voltage line VSSL in the non-display area NDA. For this reason, the low potential voltage of the low potential voltage line VSSL can be applied to the second electrodes 220.

Each of the pixels PX can comprise a first sub-pixel PX1, a second sub-pixel PX2, and a third sub-pixel PX3. The first sub-pixel PX1, the second sub-pixel PX2, and the third sub-pixel PX3 of each of the pixels PX can be arranged in regions defined in a matrix form by the first electrodes 210, the second electrodes 220, and data lines D1 to Dm. Although FIG. 5 illustrates that the pixel PX comprises three sub-pixels, it is not limited thereto, and each of the pixels PX can comprise four or more sub-pixels.

The first sub-pixel PX1, the second sub-pixel PX2, and the third sub-pixel PX3 of each of the pixels PX can be disposed in the first direction (X-axis direction), but are not limited thereto. That is, the first sub-pixel PX1, the second sub-pixel PX2, and the third sub-pixel PX3 of each of the pixels PX are disposed in the second direction (Y-axis direction) or in a zigzag shape and can be arranged in a variety of other forms.

The first sub-pixel PX1 can emit a first color light, the second sub-pixel PX2 can emit a second color light, and the third sub-pixel PX3 can emit a third color light. The first color light can be red light, the second color light can be green light, and the third color light can be blue light, but are not limited thereto.

In the non-display area NDA of the display panel 10, a pad part PA comprising data pads DP1 to $DP_p$, floating pads FD1 and FD2, and power pads PP1 and PP2, and a driving circuit 20, a first floating line FL1, a second floating line FL2, and a low potential voltage line VSSL can be disposed.

The pad part PA comprising the data pads DP1 to $DP_p$, the floating pads FD1 and FD2, and the power pads PP1 and PP2 can be disposed in one edge of the display panel 10, for example, an edge of the lower side. The data pads DP1 to $DP_p$, the floating pads FD1 and FD2, and the power pads PP1 and PP2 can be disposed side by side in the first direction (X-axis direction) of the pad part PA.

A circuit board can be attached using an anisotropic conductive film on the data pads DP1 to $DP_p$, the floating pads FD1 and FD2, and the power pads PP1 and PP2. Accordingly, the circuit board, the data pads DP1 to $DP_p$, the floating pads FD1 and FD2, and the power pads PP1 and PP2 can be electrically connected.

The driving circuit 20 can be connected to the data pads DP1 to $DP_p$ through the link lines LL. The driving circuit 20 can receive digital video data DATA and timing signals through the data pads DP1 to $DP_p$. The driving circuit 20 can convert the digital video data DATA into analog data voltages and supply them to the data lines D1 to Dm of the display panel 10.

The low potential voltage line VSSL can be connected to the first power pad PP1 and the second power pad PP2 of the pad part PA. The low potential voltage line VSSL can extend long in the second direction (Y-axis direction) in the non-display area NDA located in the left outside and the right outside of the display area DA. The low potential voltage line VSSL can be connected to the second electrode 220. For this reason, the low potential voltage of the power supply circuit 50 is applied to the second electrode 220 through the circuit board, the first power pad PP1, the second power pad PP2 and the low potential voltage line VSSL.

The first floating line FL1 can be connected to the first floating pad FD1 of the pad part PA. The first floating line FL1 can extend long in the second direction (Y-axis direction) in the non-display area NDA located in the left outside and the right outside of the display area DA.

The first floating pad FD1 and the first floating line FL1 can be dummy pads or dummy lines to which no voltage is applied.

The second floating line FL2 can be connected to the second floating pad FD2 of the pad part PA. The first floating line FL1 can extend long in the second direction (Y-axis direction) in the non-display area NDA located in the left outside and the right outside of the display area DA.

The second floating pad FD2 and the second floating line FL2 can be dummy pads or dummy lines to which no voltage is applied.

Meanwhile, since the light emitting devices (300 in FIG. 6) have a very small size, it is difficult that they are mounted on the first sub-pixel PX1, the second sub-pixel PX2, and the third sub-pixel PX3 of each of the pixels PX.

In order to solve this problem, an alignment method using a dielectrophoresis scheme has been proposed.

That is, an electric field can be formed in each of the first sub-pixel PX1, the second sub-pixel PX2, and the third sub-pixel PX3 of the pixels PX to align the light emitting devices 300 during the manufacturing process. Specifically, the light emitting devices 300 can be aligned by applying a dielectrophoretic force to the light emitting devices 300 using a dielectrophoresis scheme during a manufacturing process.

However, during the manufacturing process, it is difficult to apply a ground voltage to the first electrodes 210 by driving the thin film transistors.

Therefore, in the manufactured display device, the first electrodes 210 can be spaced apart at predetermined intervals in a first direction (X-axis direction), but during the manufacturing process, the first electrodes 210 may not be disconnected in a first direction (X-axis direction) and n be extended and can be disposed to extend long.

For this reason, the first electrodes 210 can be connected to the first floating line FL1 and the second floating line FL2 during the manufacturing process. Therefore, the first electrodes 210 can receive a ground voltage through the first floating line FL1 and the second floating line FL2. Accordingly, by disconnecting the first electrodes 210 after aligning the light emitting devices 300 using a dielectrophoresis scheme during the manufacturing process, the first electrodes 210 can be spaced apart at predetermined intervals in the first direction (X-axis direction).

Meanwhile, the first floating line FL1 and the second floating line FL2 are lines for applying a ground voltage during a manufacturing process, and no voltage can be applied in the manufactured display device. Alternatively, the ground voltage can be applied to the first floating line FL1 and the second floating line FL2 to prevent static electricity in the manufactured display device.

Figure 6:
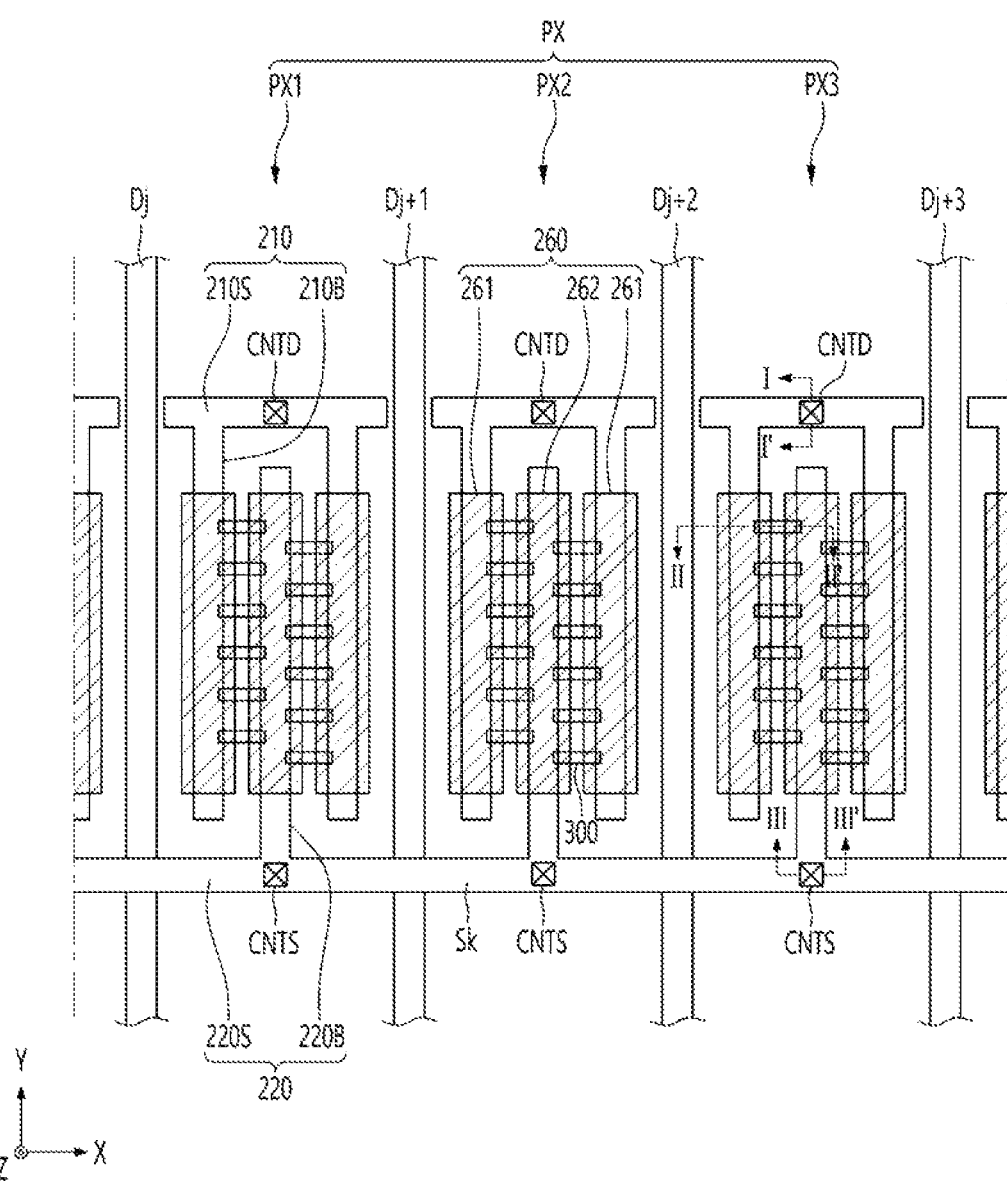
FIG. 6 is a plan view showing pixels of the display area of FIG. 5 in detail.

FIG. 6 is a plan view showing pixels of the display area of FIG. 5 in detail.

Referring to FIG. 6, the pixel PX can comprise a first sub-pixel PX1, a second sub-pixel PX2, and a third sub-pixel PX3. The first sub-pixel PX1, the second sub-pixel PX2, and the third sub-pixel PX3 of each of the pixels PX can be arranged in a matrix form in regions defined by the intersection structure of the scan lines Sk and the data lines Dj, Dj+1, Dj+2, and Dj+3.

The scan lines Sk can extend long in a first direction (X-axis direction), and the data lines Dj, Dj+1, Dj+2, and Dj+3 can extend long in the second direction (Y-axis direction) crossing the first direction (X-axis direction).

Each of the first sub-pixel PX1, the second sub-pixel PX2, and the third sub-pixel PX3 can comprise a first electrode 210, a second electrode 220, and a plurality of light emitting devices 300. The first electrode 210 and the second electrode 220 can be electrically connected to the light emitting devices 300 and can receive voltages to emit light of the light emitting device 300.

The first electrode 210 of any one sub-pixel among the first sub-pixel PX1, the second sub-pixel PX2, and the third sub-pixel PX3 can be spaced apart from the first electrode 210 of sub-pixel adjacent to the one sub-pixel. For example, the first electrode 210 of the first sub-pixel PX1 can be spaced apart from the first electrode 210 of the second sub-pixel PX2 adjacent thereto. Also, the first electrode 210 of the second sub-pixel PX2 can be spaced apart from the first electrode 210 of the third sub-pixel PX3 adjacent thereto. Also, the first electrode 210 of the third sub-pixel PX3 can be spaced apart from the first electrode 210 of the first sub-pixel PX1 adjacent thereto.

In contrast, the second electrode 220 of any one sub-pixel among the first sub-pixel PX1, the second sub-pixel PX2, and the third sub-pixel PX3 can be connected to the second electrode 220 of sub-pixel adjacent to the one sub-pixel. For example, the second electrode 220 of the first sub-pixel PX1 can be connected to the second electrode 210 of the adjacent second sub-pixel PX2. Also, the second electrode 220 of the second sub-pixel PX2 can be connected to the second electrode 220 of the third sub-pixel PX3 adjacent thereto. Also, the second electrode 220 of the third sub-pixel PX3 can be connected to the second electrode 220 of the first sub-pixel PX1 adjacent thereto.

In addition, during the manufacturing process, the first electrode 210 and the second electrode 220 can be used to form an electric field in each of the first sub-pixel PX1, the second sub-pixel PX2, and the third sub-pixel PX3 to align the light emitting device 300. Specifically, the light emitting devices 300 can be aligned by applying a dielectrophoretic force to the light emitting devices 300 using a dielectrophoresis scheme during the manufacturing process. An electric field is formed by the voltage applied to the first electrode 210 and the second electrode 220, and a dielectrophoretic force is formed by the electric field such that the dielectrophoretic force can be applied to the light emitting device 300.

The first electrode 210 is an anode electrode connected to the second conductivity type semiconductor layer of the light emitting devices 300, and the second electrode 220 is a cathode electrode connected to the first conductivity type semiconductor layer of the light emitting devices 300. The first conductivity type semiconductor layer of the light emitting devices 300 can be an n-type semiconductor layer, and the second conductivity type semiconductor layer can be a p-type semiconductor layer. However, the present invention is not limited thereto, and the first electrode 210 can be a cathode electrode and the second electrode 220 can be an anode electrode.

The first electrode 210 can comprise a first electrode stem 210S extending long in a first direction (X-axis direction) and at least one first electrode branch 210B branching from the first electrode stem 210S in a second direction (Y-axis direction). The second electrode 220 can comprise a second electrode stem 220S extending long in a first direction (X-axis direction) and at least one second electrode branch 220B branching from the second electrode stem 220S in a second direction (Y-axis direction).

The first electrode stem 210S can be electrically connected to the thin film transistor 120 through the first electrode contact hole CNTD.

For this reason, the first electrode stem 210S can receive a predetermined driving voltage through the thin film transistor 120. The thin film transistor 120 to which the first electrode stem 210S is connected can be the driving transistor DT shown in FIG. 4.

The second electrode stem 220S can be electrically connected to the low potential auxiliary wire 161 through the second electrode contact hole CNTS.

Accordingly, the second electrode stem 220S can receive a low potential voltage of the low potential auxiliary wire 161. In FIG. 6, the second electrode stem 220S can be connected to the low potential auxiliary wire 161 through the second electrode contact hole CNTS in each of the first sub-pixel PX1, the second sub-pixel PX2, and the third sub-pixel PX3 of the pixel PX, but the present invention is not limited thereto. For example, the second electrode stem 220S can be connected to the low potential auxiliary wire 161 through the electrode contact hole CNTS in any one of the first sub-pixel PX1, the second sub-pixel PX2, and the third sub-pixel PX3 of the pixel PX. Alternatively, as shown in FIG. 5, since the second electrode stem 220S is connected to the low potential voltage line VSSL of the non-display area NDA, it may not be connected to the low potential auxiliary line 161. That is, the second electrode contact hole CNTS can be omitted.

The first electrode stem 210S of one sub-pixel can be disposed parallel to the first electrode stem 210S of sub-pixel adjacent to the one sub-pixel in a first direction (X-axis direction) in a first direction (X-axis direction). For example, the first electrode stem 210S of the first sub-pixel PX1 is disposed parallel to the first electrode stem 210S of the second sub-pixel PX2 in the first direction (X-axis direction). The first electrode stem 210S of the second sub-pixel PX2 is disposed parallel to the first electrode stem 210S of the third sub-pixel PX3 in the first direction (X-axis direction). The first electrode stem 210S of the third sub-pixel PX3 can be disposed parallel to the first electrode stem 210S of the first sub-pixel PX1 in the first direction (X-axis direction). This is because the first electrode stems 210S were connected as one during the manufacturing process, and then disconnected through a laser process after the light emitting devices 300 were aligned.

The second electrode branch 220B can be disposed between the first electrode branch 210B. The first electrode branches 210B can be symmetrically disposed with respect to the second electrode branches 220B. In FIG. 6, each of the first sub-pixel PX1, the second sub-pixel PX2, and the third sub-pixel PX3 of the pixel PX can comprise two first electrode branches 220B, but the present invention is not limited thereto. For example, each of the first sub-pixel PX1, the second sub-pixel PX2, and the third sub-pixel PX3 of the pixel PX can comprise three or more first electrode branches 220B.

In addition, in FIG. 6, each of the first sub-pixel PX1, the second sub-pixel PX2, and the third sub-pixel PX3 of the pixel PX can comprise one second electrode branch 220B, but the present invention is not limited thereto. For example, when each of the first sub-pixel PX1, the second sub-pixel PX2, and the third sub-pixel PX3 of the pixel PX can comprise a plurality of second electrode branches 220B, the first electrode branch 210B can be disposed between the second electrode branch 220B. That is, in each of the first sub-pixel PX1, the second sub-pixel PX2, and the third sub-pixel PX3 of the pixel PX, the first electrode branch 210B, the second electrode branch 220B, the first electrode branch 210B and the second electrode branch 220B can be sequentially arranged in the first direction (X-axis direction).

The plurality of light emitting devices 300 can be disposed between the first electrode branch 210B and the second electrode branch 220B. One end of at least one light emitting device 300 among the plurality of light emitting devices 300 is disposed to overlap the first electrode branch 210B, and the other end is disposed to overlap the second electrode branch 220B. A second conductivity type semiconductor layer, which is a p-type semiconductor layer, can be disposed at one end of each of the plurality of light emitting devices 300, and a first conductivity type semiconductor layer, which is an n-type semiconductor layer, can be disposed at the other end, but is not limited thereto. For example, a first conductivity type semiconductor layer, which is an n-type semiconductor layer, can be disposed at one end of the plurality of light emitting devices 300, and a second conductivity type semiconductor layer, which is a p-type semiconductor layer, can be disposed at the other end.

The plurality of light emitting devices 300 can be disposed substantially side by side in the first direction (X-axis direction). The plurality of light emitting devices 300 can be spaced apart from each other in the second direction (Y-axis direction). In this case, the spacing interval between the plurality of light emitting devices 300 can be different from each other. For example, some of the plurality of light emitting devices 300 can be adjacently disposed to form one group, and the remaining light emitting devices 300 can be adjacently disposed to form another group.

A connection electrode 260 can be disposed on the first electrode branch 210B and the second electrode branch 220B, respectively. The connection electrodes 260 can be disposed to extend long in the second direction (Y-axis direction) and spaced apart from each other in the first direction (X-axis direction). The connection electrode 260 can be connected to one end of at least one light emitting device 300 among the light emitting devices 300. The connection electrode 260 can be connected to the first electrode 210 or the second electrode 220.

The connection electrode 260 can comprise a first connection electrode 261 disposed on the first electrode branch 210B and connected to one end of at least one light emitting device 300 of the light emitting devices 300, and a second connection electrode 262 disposed on the branch portion 220B and connected to one end of at least one light emitting device 300 of the light emitting devices 300. For this reason, the first connection electrode 261 serves to electrically connect the plurality of light emitting devices 300 to the first electrode 210, and the second connection electrode 262 serves to electrically connect the plurality of light emitting devices 300 to the second electrode 220.

A width of the first connection electrode 261 in the first direction (X-axis direction) can be greater than a width of the first electrode branch 210B in the first direction (X-axis direction). Also, the width of the second connection electrode 262 in the first direction (X-axis direction) can be greater than the width of the second electrode branch 220B in the first direction (X-axis direction).

For example, each end of the light emitting devices 300 is disposed on the first electrode branch 210B of the first electrode 210 and the second electrode branch 220B of the second electrode 220, but due to an insulating layer (not shown) formed on the first electrode 210 and the second electrode 220, the light emitting device 300 may not be electrically connected to the first electrode 210 and the second electrode 220. Accordingly, portions of a side surface and/or an upper surface of the light emitting device 300 can be electrically connected to the first connection electrode 261 and the second connection electrode 262, respectively.

Figure 7:
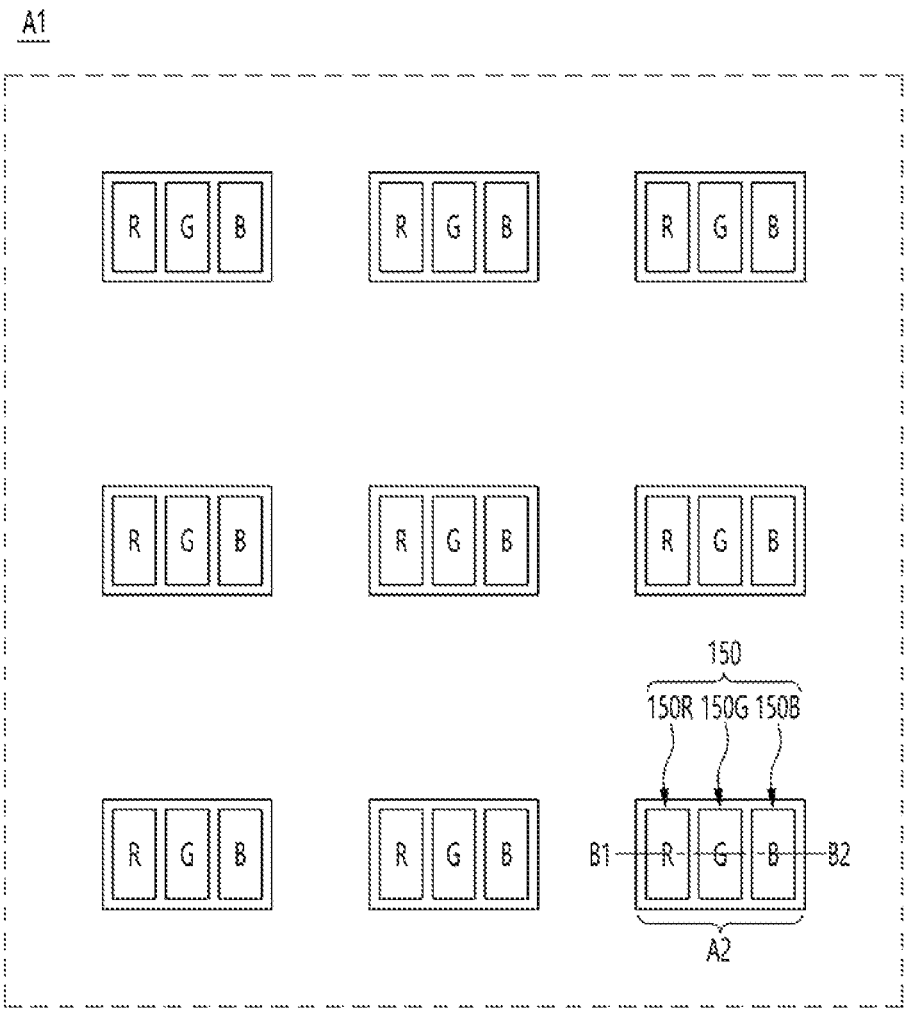
FIG. 7 is an enlarged view of a first panel area in the display device of FIG. 2.

FIG. 7 is an enlarged view of a first panel area in the display device of FIG. 2.

Referring to FIG. 7, a display device 100 of the embodiment can be manufactured by mechanically and electrically connecting a plurality of panel regions such as the first panel region A1 by tiling.

The first panel region A1 can comprise a plurality of light emitting devices 150 disposed for each unit pixel (PX in FIG. 3). The light emitting device 150 can be the light emitting device 300 of FIG. 6.

The light emitting device 150 can comprise, for example, a red light emitting device 150R, a green light emitting device 150G, and a blue light emitting device 150B. For example, the unit pixel PX can comprise a first sub-pixel PX1, a second sub-pixel PX2, and a third sub-pixel PX3. For example, a plurality of red light emitting devices 150R are disposed in the first sub-pixel PX1, a plurality of green light emitting devices 150G are disposed in the second sub-pixel PX2, and a plurality of blue light emitting devices 150B can be disposed in the third sub-pixel PX3. The unit pixel PX can further comprise a fourth sub-pixel in which no light emitting device is disposed, but is not limited thereto.

Figure 8:
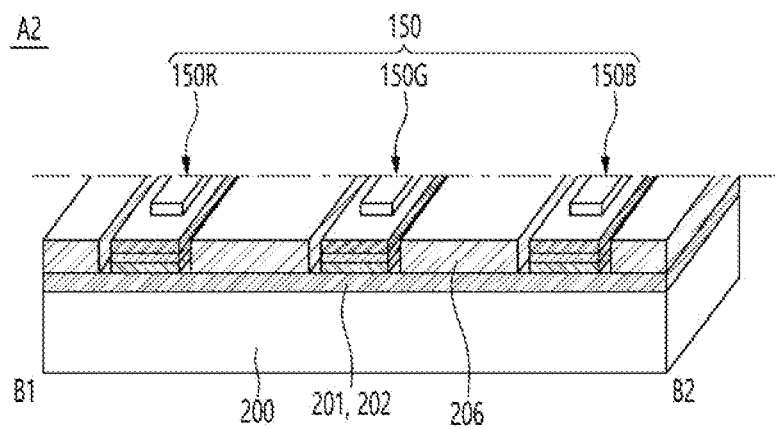
FIG. 8 is an enlarged view of the area A2 of FIG. 7.

FIG. 8 is an enlarged view of the area A2 of FIG. 7.

Referring to FIG. 8, the display device 100 according to an embodiment can comprise a substrate 200, wiring electrodes 201 and 202, an insulating layer 206, and a plurality of semiconductor light emitting devices 150.

The wiring electrode can comprise a first wiring electrode 201 and a second wiring electrode 202 spaced apart from each other.

The semiconductor light emitting device 150 can comprise a red semiconductor light emitting device 150R, a green semiconductor light emitting device 150G, and a blue semiconductor light emitting device 150B to form a sub-pixel, but is not limited thereto. In other words, red and green can be implemented by providing a red phosphor and a green phosphor.

The substrate 200 can be formed of glass or polyimide. In addition, the substrate 200 can comprise a flexible material such as polyethylene naphthalate (PEN) or polyethylene terephthalate (PET). In addition, the substrate 200 can be a transparent material, but is not limited thereto.

The insulating layer 130 can comprise an insulating and flexible material such as polyimide, PEN, PET, or the like, and can be integrally formed with the substrate 200 to form a single substrate.

The insulating layer 206 can be a conductive adhesive layer having adhesiveness and conductivity. The conductive adhesive layer can have ductility to enable a flexible function of the display device. For example, the insulating layer 206 can be an anisotropic conductive film (ACF). For example, the insulating layer 206 can a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The insulating layer 206 can comprise an assembly hole 203 into which the semiconductor light emitting device 150 is inserted. Therefore, during self-assembly, the semiconductor light emitting device 150 can be easily inserted into the assembly hole 203 of the insulating layer 206.

Meanwhile, the display device according to the embodiment uses a light emitting device as a light source. The light emitting device of the embodiment is a self-light emitting device that emits light by itself when electricity is applied, and can be a semiconductor light emitting device. Since the light emitting device of the embodiment is made of an inorganic semiconductor material, it is resistant to deterioration and has a semi-permanent lifespan such that it can contribute to implementing high-quality and high-definition image in a display device by providing stable light.

Figure 9:
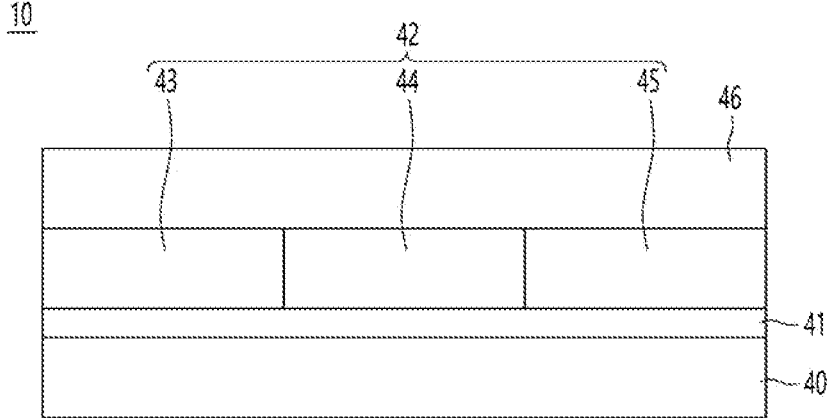
FIG. 9 is a schematic cross-sectional view of the display panel of FIG. 3.

FIG. 9 is a schematic cross-sectional view of the display panel of FIG. 3.

Referring to FIG. 9, the display panel 10 of the embodiment can comprise a first substrate 40, a light emitting structure 41, a color generator 42 and a second substrate 46. The display panel 10 of the embodiment can comprise more components than these, but is not limited thereto. The first substrate 40 can be the substrate 200 shown in FIG. 8.

Although not shown, at least one or more insulating layers between the first substrate 40 and the light emitting structure 41, between the light emitting structure 41 and the color generator 42, and/or between the color generator 42 and the second substrate 46, but is not limited thereto.

The first substrate 40 can support the light emitting structure 41, the color generator 42, and the second substrate 46. The second substrate 46 can comprise various elements as described above. For example, the second substrate 46 can comprise the data lines (D1 to Dm, where m is an integer greater than or equal to 2), the scan lines S1 to Sn, the high potential voltage line VDDL and the low potential voltage line VSSL as shown in FIG. 3, a plurality of transistors and at least one capacitor as shown in FIG. 4, and a first electrode 210 and a second electrode 220 as shown in FIG. 5.

The first substrate 40 can be formed of glass, but is not limited thereto.

The light emitting structure 41 can provide light to the color generator 42. The light emitting structure 41 can comprise a plurality of light sources that emit light themselves by applying electricity. For example, the light source can comprise a light emitting device (300 in FIG. 6, 150 in FIG. 7).

As an example, the plurality of light emitting devices 300 are disposed separately for each sub-pixel of a pixel, and can independently emit light by controlling each sub-pixel.

As another example, the plurality of light emitting devices 300 can be arranged regardless of pixel division and simultaneously emit light from all sub-pixels.

The light emitting device 300 of the embodiment can emit blue light, but is not limited thereto. For example, the light emitting device 300 of the embodiment can emit white light or purple light.

The color generator 42 can generate of a different color light from the light provided by the light emitting structure 41.

For example, the color generator 42 can comprise a first color generator 43, a second color generator 44, and a third color generator 45. The first color generator 43 can correspond to the first sub-pixel PX1 of the pixel, the second color generator 44 can correspond to the second sub-pixel PX2 of the pixel, and the third color generator 45 can correspond to the third sub-pixel PX3 of the pixel.

The first color generator 43 can generate first color light based on the light provided from the light emitting structure 41, and the second color generator 44 can generate second color light based on the light provided from the light emitting structure 41, and the third color generator 45 can generate third color light based on light provided from the light emitting structure 41. For example, the first color generator 43 can output blue light from the light emitting structure 41 as red light, and the second color generator 44 can output blue light from the light emitting structure 41 as green light, and the third color generator 45 can output blue light from the light emitting structure 41 as it is.

As an example, the first color generator 43 can comprise a first color filter, the second color generator 44 can comprise a second color filter, and the third color generator 45 can comprise a third color filter.

The first color filter, the second color filter, and the third color filter can be formed of a transparent material through which light can pass.

For example, at least one of the first color filter, the second color filter, and the third color filter can comprise a quantum dot.

The quantum dot of the embodiment can be selected from a group II-IV compound, a group IV-VI compound, a group IV element, a group IV compound, and a combination thereof.

The group II-VI compound can be selected the groups consisting of a binary compound selected from the group consisting of CdSe, CdTe, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof; and quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-V compound can be selected the groups consisting of a binary compound selected from the group consisting of GaN, GaP, GaAs, GaSb, AlN, AlP, AlAs, AlSb, InN, InP, InAs, InSb and mixtures thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI compound can be selected the groups consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof.

The group IV element can be selected from the group consisting of Si, Ge, and mixtures thereof. The group IV compound can be a binary element compound selected from the group consisting of SiC, SiGe, and mixtures thereof.

Such quantum dot can have a full width of half maximum (FWHM) of an emission wavelength spectrum of approximately 45 nm or less, and light emitted through the quantum dot can be emitted in all directions. Accordingly, the viewing angle of the light emitting display device can be improved.

Meanwhile, the quantum dot can have a shape such as spherical, pyramidal, multi-arm, or cubic nanoparticles, nanotubes, nanowires, nanofibers, nanoplatelet particles, etc., but are not limited thereto.

For example, when the light emitting device 300 emits blue light, the first color filter can comprise red quantum dots, and the second color filter can comprise green quantum dots. The third color filter may not include quantum dots, but is not limited thereto. For example, blue light from the light emitting device 300 is absorbed by the first color filter, and the wavelength of the absorbed blue light is shifted by red quantum dots to output red light. For example, blue light from the light emitting device 300 is absorbed by the second color filter, and the wavelength of the absorbed blue light is shifted by green quantum dots to output green light. For example, blue light from the light emitting device 300 can be absorbed by the third color filter, and the absorbed blue light can be output as it is.

Meanwhile, when the light emitting device 300 emits white light, not only the first color filter and the second color filter, but also the third color filter can comprise quantum dots. That is, the wavelength of white light of the light emitting device 300 can be shifted to blue light by the quantum dots included in the third color filter.

For example, at least one of the first color filter, the second color filter, and the third color filter can comprise a phosphor. For example, some of the first color filter, the second color filter, and the third color filter can comprise quantum dots, and others can comprise phosphors. For example, each of the first color filter and the second color filter can comprise a phosphor and a quantum dot. For example, at least one of the first color filter, the second color filter, and the third color filter can comprise scattering particles. Since blue light incident on each of the first color filter, the second color filter, and the third color filter is scattered by the scattering particles and the color of the scattered blue light is shifted by the corresponding quantum dots, light output efficiency can be improved.

As another example, the first color generator 43 can comprise a first color conversion layer and a first color filter. The second color generator 44 can comprise a second color conversion layer and a second color filter. The third color generator 45 can comprise a third color conversion layer and a third color filter. Each of the first color conversion layer, the second color conversion layer, and the third color conversion layer can be disposed adjacent to the light emitting structure 41. The first color filter, the second color filter and the third color filter can be disposed adjacent to the second substrate 46.

For example, the first color filter can be disposed between the first color conversion layer and the second substrate 46. For example, the second color filter can be disposed between the second color conversion layer and the second substrate 46. For example, the third color filter can be disposed between the third color conversion layer and the second substrate 46.

For example, the first color filter can contact the upper surface of the first color conversion layer and have the same size as the first color conversion layer, but is not limited thereto. For example, the second color filter can contact the upper surface of the second color conversion layer and have the same size as the second color conversion layer, but is not limited thereto. For example, the third color filter can contact the upper surface of the third color conversion layer and have the same size as the third color conversion layer, but is not limited thereto.

For example, the first color conversion layer can comprise red quantum dots, and the second color conversion layer can comprise green quantum dots. The third color conversion layer may not include quantum dots. For example, the first color filter can comprise a red-based material that selectively transmits the red light converted in the first color conversion layer, and the second color filter can comprise a green-based material that selectively transmits the green light converted in the second color conversion layer, and the third color filter can comprise a blue-based material that selectively transmits blue light transmitted as it is through the third color conversion layer.

Meanwhile, when the light emitting device 300 emits white light, the third color conversion layer as well as the first color conversion layer and the second color conversion layer can also comprise quantum dots. That is, the wavelength of white light of the light emitting device 300 can be shifted to blue light by the quantum dots included in the third color filter.

Referring back to FIG. 9, the second substrate 46 can be disposed on the color generator 42 to protect the color generator 42. The second substrate 46 can be formed of glass, but is not limited thereto.

The second substrate 46 can be called a cover window, cover glass, or the like.

The second substrate 46 can be formed of glass, but is not limited thereto.

Meanwhile, the embodiment can provide a self-assembly device capable of securing uniform luminance for each pixel. The embodiment can provide a self-assembly device capable of securing high luminance. The embodiment can provide a self-assembly device capable of improving the self-assembly speed. Specifically, in the embodiment, the substrate may not be bent during self-assembly. In the self-assembly, the plurality of light emitting devices disposed for assembly can be positioned at uniform intervals over the entire area of the substrate. Accordingly, the embodiment can secure uniform luminance for each pixel, secure high luminance, and improve self-assembly speed.

The embodiment can provide a self-assembly device capable of easily recovering light emitting devices. Specifically, since the light emitting devices not assembled on the substrate are located on the surface of the fluid, the light emitting devices can be easily recovered through the recovery device.

Various embodiments for achieving these challenges are described below.

[Self-Assembly Device]

Figure 10:
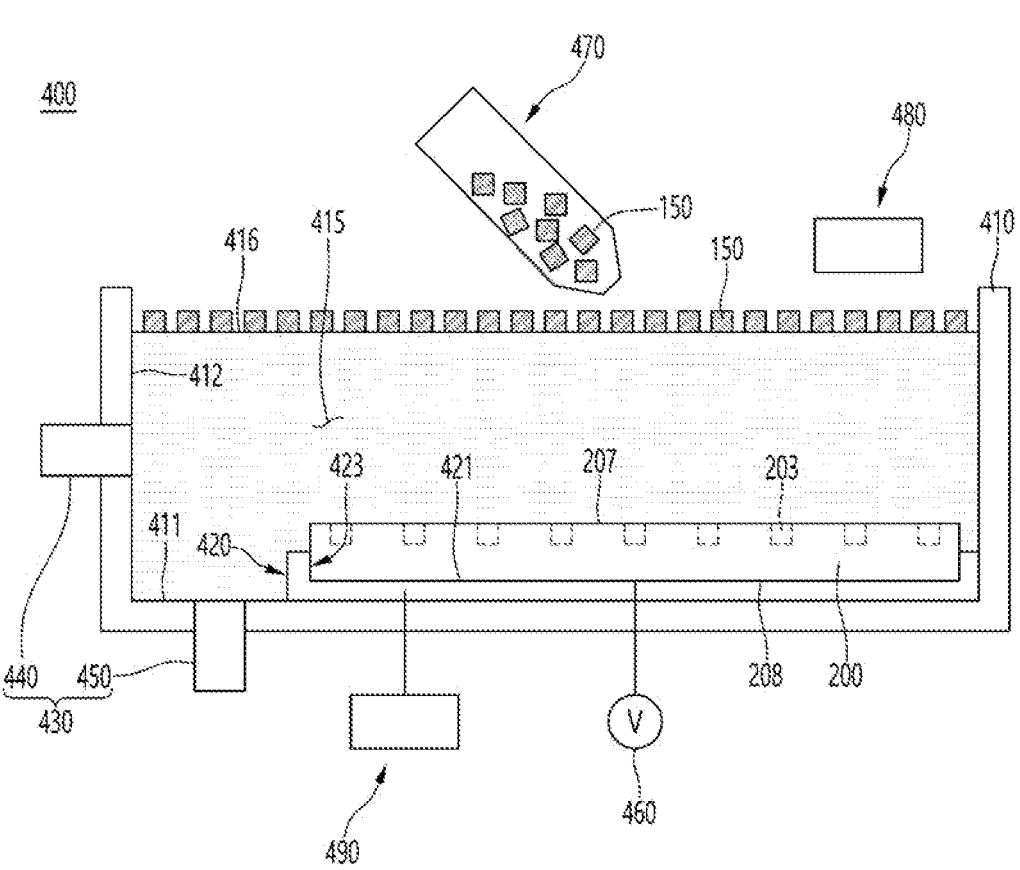
FIG. 10 illustrates a self-assembly device according to an embodiment.

FIG. 10 illustrates a self-assembly device according to an embodiment.

Referring to FIG. 10, the self-assembly device 400 according to the embodiment can comprise a chamber 410, a mounting part 420, a fluid level adjuster 430, and a voltage supplier 460. Embodiments can comprise more elements than these.

The chamber 410 can be referred to as a vessel, a container, a water tank, etc. The chamber 410 can be a place where a self-assembly process for the substrate 200 is performed. For example, the chamber 410 can contain fluid 415. For example, the chamber 410 can accommodate the substrate 200.

In an embodiment, self-assembly can mean aligning the respective light emitting devices 150 at a desired position on the substrate 200 by dielectrophoretic force caused by a voltage.

In the embodiment, the self-assembly device 400 means to a device that mounts a substrate 200 and applies an electric field to the substrate 200 to align the light emitting devices 150 and then detaches the substrate 200.

For example, the chamber 410 can comprise a bottom portion 411 and a side portion 412 extending upward from an edge area of the bottom portion 411. The bottom portion 411 and the side portion 412 can be integrally formed, but are not limited thereto. The chamber 410 can have an accommodation space by the bottom portion 411 and the side portion 412. The fluid 415 can be filled in the accommodation space of the chamber 410. For example, the fluid 415 can be DI water, but is not limited thereto.

For example, the chamber 410 can have a square shape when viewed from above, but is not limited thereto.

For example, the bottom portion 411 of the chamber 410 can have a larger size than a size of the substrate 200. For example, when the substrate 200 has a first major axis and a first minor axis having different lengths, the bottom portion 411 of the chamber 410 can also have a second major axis and a second minor axis having different lengths. In this case, the second major axis can be greater than the first major axis, and the second minor axis can be greater than the first minor axis.

The mounting part 420 can be a member for mounting the substrate 200 and can be disposed on the bottom portion 411 of the chamber 410. Although the mounting part 420 is disposed separately from the chamber 410 in the drawings, the chamber 410 and the mounting part 420 can be integrally formed.

Figure 14:
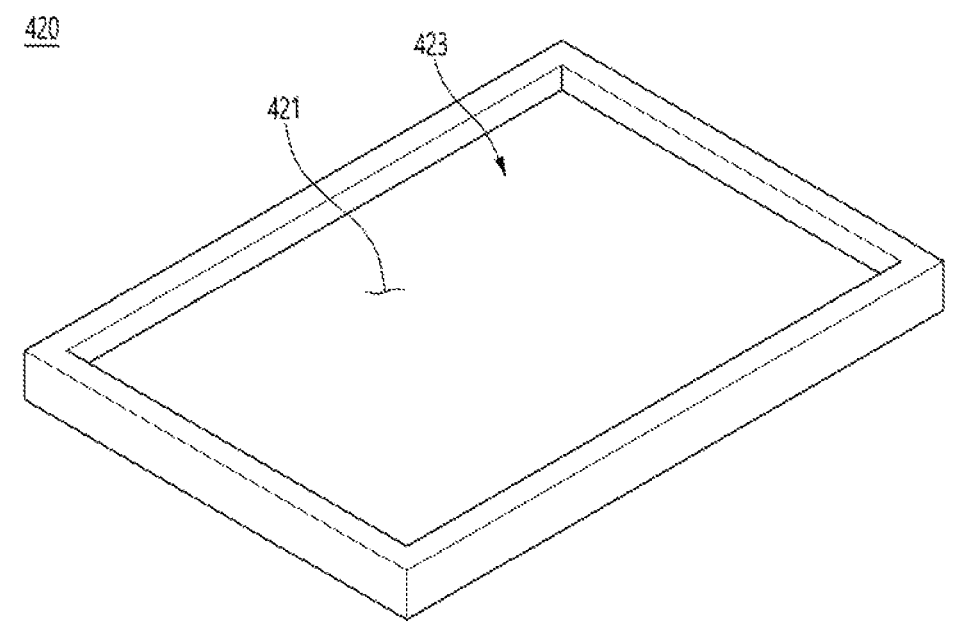
FIG. 14 illustrates a mounting part of FIG. 10.

As shown in FIG. 14, the mounting part 420 can have a fixing groove 423. For example, the size of the fixing groove 423 can be equal to or greater than the size of the substrate 200. The substrate 200 can be inserted into the fixing groove 423. Although not shown, at least one fixing part capable of fixing the substrate 200 can be installed around the fixing groove 423.

The depth of the fixing groove 423 can be equal to or greater than the thickness of the substrate 200. For example, when the substrate 200 is inserted into the fixing groove 423, the assembly surface 207 of the substrate 200 can protrude upward from an upper surface of the mounting part 420. The substrate 200 can have an assembly surface 207 on which the light emitting device 150 is assembled and an opposite surface 208 opposite to the assembly surface 207.

The fixing groove 423 can have a bottom portion 421. The bottom portion 421 can have a predetermined depth from the upper surface of the mounting part 420. The bottom portion 421 can have a flat surface.

For example, when the substrate 200 is inserted into the fixing groove 423, an inner surface of the fixing groove 423 and a side surface of the substrate 200 can come into contact with each other, but is not limited thereto. For example, when the substrate 200 is inserted into the fixing groove 423, the opposite surface 208 of the substrate 200 can come into contact with the bottom portion 421 of the fixing groove 423. Since the opposite surface 208 of the substrate 200 inserted into the fixing groove 423 can come into contact with the bottom portion 421 of the fixing groove 423 having a flat surface, the opposite surface 208 of the substrate 200 as well as the assembly surface 207 of the substrate 200 can also have a flat surface. In other words, even when the substrate 200 is mounted on the mounting part 420 for self-assembly, warpage does not occur in the substrate 200. As such, since the self-assembly process is performed in a state where the substrate 200 is not warped, a certain number of light emitting devices 150 can be assembled to each pixel of the substrate 200 to ensure uniform luminance, and high luminance can be secured by assembling more light emitting devices 150 to each pixel of the substrate 200.

The fluid level adjuster 430 can be a device capable of adjusting the height of the fluid 415 filled in the accommodation space of the chamber 410. Here, the height can be the height from the bottom portion 411 of the chamber 410.

The fluid level adjuster 430 can comprise at least one fluid supply source 440 and at least one fluid exhauster 450.

The fluid supply source 440 can supply the fluid 415 into the chamber 410. The fluid supply source 440 can be installed on the side portion 412 of the chamber 410, but is not limited thereto. For example, when the chamber 410 comprises first and second side portions facing each other and third and fourth side portions facing each other, the fluid supply source 440 can be installed on each of the first and second sides, each of the third and fourth sides, or each of the first to fourth sides. Since the fluid supply source 440 is installed on at least one side of the chamber 410 and the fluid 415 is filled in the chamber 410 within a faster time, the process time can be shortened.

The fluid exhauster 450 can exhaust the fluid 415 in the chamber 410 to the outside. The fluid exhauster 450 can be installed on the bottom portion 411 of the chamber 410, but is not limited thereto. The fluid exhauster 450 can be installed around the mounting part 420 at the bottom portion 411 of the chamber 410. For example, the mounting part 420 can have first to fourth side portions corresponding to the substrate 200 having a rectangular shape. The first and second sides can face each other and the third and fourth sides can face each other. In this case, the fluid exhauster 450 can be installed in the vicinity of each of the first and second side portions of the mounting part 420, each of the third and fourth side portions of the mounting part 420, or each of the first to fourth side portions the mounting part 420 at the bottom portion 411 of the chamber 410. Since at least one fluid exhauster 450 is installed on the bottom portion 411 of the chamber 410 and the fluid 415 in the chamber 410 is exhausted to the outside within a faster time, the process time can be shortened.

The fluid level adjuster 430 can selectively drive the fluid supply source 440 and the fluid exhauster 450 to adjust the height of the fluid 415 in the chamber 410. For example, when the opening of the fluid exhauster 450 is blocked and the fluid 415 is supplied to the chamber 410 through the fluid supply source 440, the height of the fluid 415 in the chamber 410 can increase. For example, when the opening of the fluid supply source 440 is blocked and the fluid 415 in the chamber 410 is exhausted to the outside through the fluid exhauster 450, the height of the fluid 415 in the chamber 410 can decrease.

For example, the fluid level adjuster 430 can selectively drive the fluid supply source 440 and the fluid exhauster 450 to fill the chamber 410 with the fluid 415 to a first height (H1 in FIG. 18) during self-assembly. That is, the fluid 415 can be supplied from the fluid supply source 440 into the chamber 410 and the opening of the fluid exhauster 450 can be blocked.

For example, when a plurality of light emitting devices 150 are dispersed on a surface 416 of the fluid 415, the fluid level adjuster 430 can selectively drive the fluid supply source 440 and the fluid exhauster 450 to reduce the fluid 415 in the chamber 410 from the first height H1 to a second height (H2 in FIG. 20) so that the plurality of light emitting devices 150 can be assembled on the substrate 200. That is, the opening of the fluid supply source 440 can be blocked and the fluid 415 in the chamber 410 can be exhausted to the outside through the fluid exhauster 450.

For example, the fluid level adjuster 430 can selectively drive the fluid supply source 440 and the fluid exhauster 450 to increase the fluid 415 in the chamber 410 from the second height H2 to a third height (H3 in FIG. 22) so that the light emitting devices 150 that are not assembled on the substrate 200 can be recovered. That is, the fluid 415 can be supplied into the chamber 410 from the fluid supply source 440 and the opening of the fluid exhauster 450 can be blocked. For example, the third height H3 can be equal to or smaller than the first height H1. For example, the third height H3 can be equal to or greater than the second height H2. That is, the third height H3 can be determined between the first height H1 and the second height H2.

For example, the fluid level adjuster 430 can selectively drive the fluid supply source 440 and the fluid exhauster 450 to exhaust the fluid 415 in the chamber 410 so that the substrate 200 on which the light emitting devices 150 are assembled from the chamber 410 can be taken out. That is, the opening of the fluid supply source 440 can be blocked and the fluid 415 in the chamber 410 can be exhausted to the outside through the fluid exhauster 450.

The voltage supplier 460 can apply voltage to the substrate 200 so that the light emitting device 150 can be assembled to the substrate 200 by dielectrophoretic force.

As shown in FIG. 10, after the fluid 415 is filled in the chamber 410 and the light emitting device 150 is dropped into the fluid 415, the voltage can be applied between the wiring electrodes (201 and 202 in FIG. 8) of the substrate 200 spaced apart from each other. The dielectrophoretic force can be formed between the wiring electrodes 201 and 202 by a voltage applied between the wiring electrodes 201 and 202 of the substrate 200. The light emitting device 150 can be fixed to the assembly hole 203 of the substrate 200 by the dielectrophoretic force.

In the embodiment, in order for the light emitting devices 150 dispersed on the surface 416 of the fluid 415 to be assembled in the assembly hole 203 of the substrate 200, the light emitting devices 150 need to be located to be close to the substrate 200. To this end, the fluid level adjuster 430 can adjust the height of the fluid 415 so that the surface 416 of the fluid 415 can be close to the assembly surface 207 of the substrate 200. For example, the fluid level adjuster 430 can reduce the height of the surface 416 of the fluid 415 by blocking the opening of the fluid supply source 440 and opening the opening of the fluid exhauster 450. When the surface 416 of the fluid 415 is spaced apart from the assembly surface 207 of the substrate 200 on the substrate 200 by a predetermined distance, the fluid level adjuster 430 can block the opening of the fluid exhauster 450. Here, the predetermined distance is a distance at which the light emitting devices 150 can be guided to the assembly hole 203 of the substrate 200 by the dielectrophoretic force on the substrate 200, and can be the second height H2 shown in FIG. 20.

In the embodiment, the light emitting devices 150 dispersed on the surface 416 of the fluid 415 can be positioned close to the substrate 200, and then the corresponding light emitting devices 150 can be assembled in the assembly hole 203 of the substrate 200 so that assembly accuracy and assembly speed can be improved at the same time, and luminance can be improved by minimizing assembly defects.

Meanwhile, in an embodiment, the light emitting devices 150 can float on the surface 416 of the fluid 415. To this end, the gravity of the light emitting device 150 can be smaller than the gravity of the fluid 415. That is, since the light emitting device 150 has a micro or nano size, it is very light. Thus, the light emitting device 150 can float on the surface 416 of the fluid 415 without sinking in the fluid 415.

Hereinafter, the light emitting device 150 of the embodiment will be described with reference to FIG. 11.

[Light Emitting Device]

Figure 11:
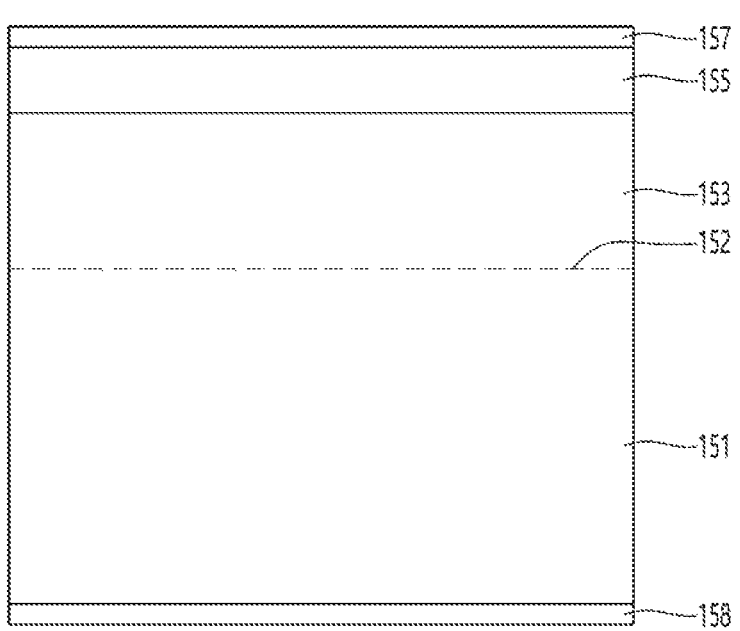
FIG. 11 is a cross-sectional view illustrating a light emitting device of an embodiment.

FIG. 11 is a cross-sectional view illustrating a light emitting device of an embodiment.

As shown in FIG. 11, the light emitting device 150 of the embodiment can comprise a first conductivity type semiconductor layer 151, an active layer 152, a second conductivity type semiconductor layer 153, a metal layer 155 and a hydrophobic-treated surface 157. The active layer 152 can be referred to as a light emitting layer or a light emitting region.

The first conductivity type semiconductor layer 151 can be referred to as a first electrode, and the second conductivity type semiconductor layer 153 and the metal layer 155 can be referred to as a second electrode.

Although not shown, an insulating layer is disposed around the side portions of the first conductivity type semiconductor layer 151, the active layer 152, and the second conductivity type semiconductor layer 153 so that electrical short circuit between the first conductivity type semiconductor layer 151 and the second conductivity type semiconductor layer 153 can be prevented and the first conductivity type semiconductor layer 151, the active layer 152 and the second conductivity type semiconductor layer 153 can be prevented from being contaminated by foreign substances.

After the first conductivity type semiconductor layer 151, the active layer 152, the second conductivity type semiconductor layer 153, and the metal layer 155 are formed on a growth substrate (not shown), a separate process, for example, LLO (Laser Lift-Off) process can be used to remove the substrate for growth. The substrate for growth can be a sapphire substrate or a semiconductor substrate, but is not limited thereto.

The first conductivity type semiconductor layer 151 can be formed on the substrate for growth. Before the first conductivity type semiconductor layer 151 is formed, a buffer layer (not shown) can be formed to alleviate lattice mismatch between the growth substrate and the first conductivity type semiconductor layer 151.

The first conductivity type semiconductor layer 171 can be provided as a compound semiconductor. The first conductivity type semiconductor layer 151 can be provided as, for example, a group 2-6 compound semiconductor or a group 3-5 compound semiconductor. For example, the first conductivity type semiconductor layer 151 can be doped with an n-type dopant such as Si, Ge, Sn, Se, Te, etc.

The active layer 152 can be formed on the first conductivity type semiconductor layer 151.

The active layer 152 generate light of a corresponding wavelength band by recombination of first carriers (e.g. electrons) provided from the first conductivity type semiconductor layer 151 and second carriers (e.g. holes) provided from the second conductivity type semiconductor layer 153. The active layer 152 can be provided in any one or more of a single well structure, a multi-well structure, a quantum dot structure, or a quantum wire structure. The active layer 152 can be provided as a compound semiconductor. The active layer 152 can be provided with, for example, a group 2-6 or group 3-5 compound semiconductor. When the active layer 152 is provided in a multi-well structure, the active layer 152 can be provided by stacking a plurality of barrier layers and a plurality of well layers.

The second conductivity type semiconductor layer 153 can be formed on the active layer 152. The second conductivity type semiconductor layer 153 can be provided as a compound semiconductor. The second conductivity type semiconductor layer 153 can be provided as, for example, a group 2-6 compound semiconductor or a group 3-5 compound semiconductor. For example, the second conductivity type semiconductor layer 153 can be doped with a p-type dopant such as Mg, Zn, Ca, Sr, Ba, etc.

The first conductivity type semiconductor layer 151, the active layer 152, and the second conductivity type semiconductor layer 153 can be grown using deposition equipment, for example, MOCVD equipment.

The metal layer 155 can be formed on the second conductivity type semiconductor layer 153.

The metal layer 155, the second conductivity type semiconductor layer 153, the active layer 152, and the first conductivity type semiconductor layer 151 can be etched using the mesa process. The first conductivity type semiconductor layer 151, the active layer 152, the second conductivity type semiconductor layer 153, and the metal layer 155 can be formed through the mesa process.

The hydrophobic-treated surface 157 can be disposed on one surface of the light emitting device 150. The hydrophobic-treated surface 157 can be a member capable of adjusting the assembly directionality of the light emitting device 150. For example, an upper surface of the metal layer 155 of the light emitting device 150 can have a hydrophobic-treated surface 157. The hydrophobic-treated surface 157 can be referred to as a hydrophobic treatment layer having a predetermined thickness.

As an example, before the LLO process is performed to remove the substrate for growth, a hydrophobicity treated surface can be formed by coating self-assembled monolayer (SAM) on the upper surface of the metal layer 155. The SAM having hydrophobicity can comprise octadecyltrichlorosilane (OTS) and perfluorodecyltrichlorosilane (PFS). For example, in OTS, the surface group is composed of CH3 and the water contact angle can be 110°. For example, in PFS, the surface group is composed of CF3 and the water contact angle can be 120°.

As another example, the hydrophobic-treated surface 157 can be formed by performing plasma treatment using a fluorine-based gas on the upper surface of the metal layer 155 before the LLO process is performed to remove the growth substrate. The fluorine-based gas can be selected from the group consisting of $F_2$, $BF_3$, HF, $NF_3$, $CF_4$, $SF_6$, $CH_2F_2$, $CHF_3$, $C_2F_6$, $C_2F_8$, $C_3F_6$, $C_3F_8$, $C_4F_6$, $C_4F_8$, $C_4F_{10}$, $C_6F_{10}$, $C_5F_{12}$, $SF_5$, $WF_6$, $SiF_4$, $Si_2F_6$, $XeF_2$, and combinations thereof.

Meanwhile, when a lower surface of the first conductive semiconductor layer 151 of the light emitting device 150 is in contact with the bottom surface of the assembly hole 203 of the substrate 200, the corresponding light emitting device 150 can be a normal light emitting device. The light emitting device 150 normally assembled in the assembly hole 203 of the substrate 200 can emit light by an electrical signal.

When the upper surface of the metal layer 155 of the light emitting device 150 is in contact with the bottom surface of the assembly hole 203 of the substrate 200, the corresponding light emitting device 150 can be a defective light emitting device. The defective light emitting device assembled in the assembly hole 203 of the substrate 200 does not emit light by an electrical signal. That is, the corresponding defective light emitting device does not contribute to the increase in luminance of the corresponding pixel. Therefore, as the number of defective light emitting devices that do not contribute to the increase in luminance in the corresponding pixel increases, the luminance of the corresponding pixel can be significantly reduced.

In this case, when the light emitting device 150 is reduced to a micro or nano size, the light emitting device 150 can be turned over on the surface 416 of the fluid 415 because it is light. Even if the light emitting device 150 is turned over and the hydrophobic-treated surface 157 of the light emitting device 150 is in contact with the surface 416 of the fluid 415, the light emitting device 150 can be turned over again by the repulsive force with the surface 416 of the fluid 415 due to the hydrophobic-treated surface 157 of the light emitting device 150 so that the lower surface of the first conductivity type semiconductor layer 151 of the light emitting device 150 can be in contact with the surface 416 of the fluid 415. Therefore, the lower surface of the first conductivity type semiconductor layer 151 of the light emitting device 150 in contact with the surface 416 of the fluid 415 by the dielectrophoretic force formed on the substrate 200 can be assembled in the assembly hole 203 of the substrate 200 so that it can come into contact with the bottom surface of the assembly hole 203 of the substrate 200. As such, the light emitting device 150 normally assembled in the assembly hole 203 of the substrate 200 can contribute to an increase in luminance of the corresponding pixel.

Therefore, in the embodiment, the upper surface of the metal layer 155 of the light emitting device 150 can have a hydrophobic-treated surface 157 so that the assembly directionality of the light emitting device 150 can be adjusted. Accordingly, the lower surface of the first conductivity type semiconductor layer 151 of the light emitting device 150 can be in contact with the surface 416 of the fluid 415 so that since the number of normal light emitting devices in each pixel of the substrate 200 is increased, luminance can be remarkably improved. In addition, in the embodiment, the light emitting device 150 can be accurately assembled in the assembly hole 203 of the substrate 200 by adjusting the assembly directionality of the light emitting device 150. Accordingly, assembly accuracy and assembly speed can be improved.

On the other hand, the light emitting device 150 of the embodiment can comprise a hydrophilic-treated surface 158, but is not limited thereto.

The hydrophilic-treated surface 158 can be a member capable of adjusting the assembly directionality of the light emitting device 150. For example, the lower surface of the first conductivity type semiconductor layer 151 of the light emitting device 150 can have a hydrophilic-treated surface 158. The hydrophilic-treated surface 158 can be referred to as a hydrophilic treatment layer having a predetermined thickness.

For example, when the lower surface of the first conductivity type semiconductor layer 151 of the light emitting device 150 has excellent hydrophilic properties, the hydrophilic-treated surface 158 can be omitted.

Since the lower surface of the first conductivity type semiconductor layer 151 of the light emitting device 150 has the hydrophilic-treated surface 158, the assembly directionality of the light emitting device 150 can be more easily adjusted.

Figure 12:
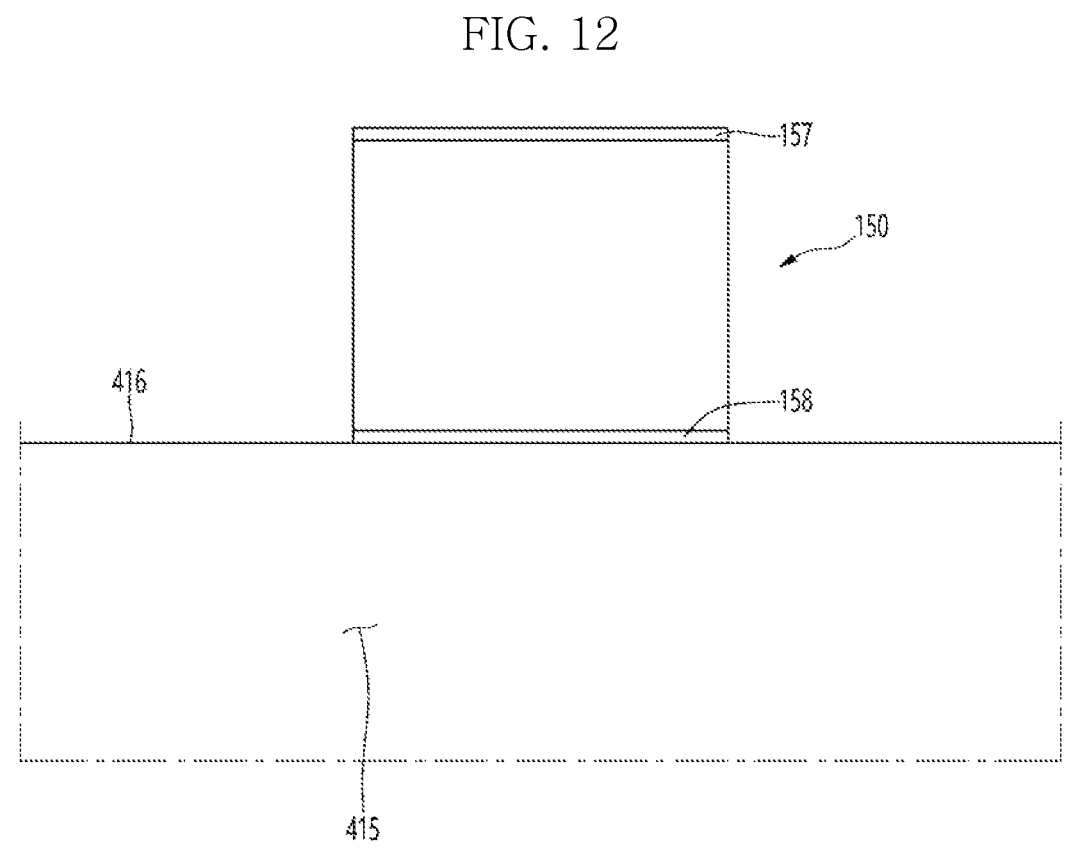

That is, in the embodiment, one surface of the light emitting device 150 can have a hydrophobic-treated surface 157 and an opposite surface 208 opposite to one surface of the light emitting device 150 can have a hydrophilic-treated surface 158. In this case, when the light emitting devices 150 are dropped in the fluid 415 and the hydrophilic-treated surface 158 of the light emitting device 150 is in contact with the surface 416 of the fluid 415 as shown in FIG. 12, the light emitting device 150 can adhere to the surface 416 of the fluid 415 more strongly.

Although not shown, when the hydrophobic-treated surface 157 of the light emitting device 150 is in contact with the surface 416 of the fluid 415, the hydrophobic-treated surface 157 of the light emitting device 150 can be repelled by the surface 416 of the fluid 415 and the light emitting device 150 can be turned over so that the hydrophilic-treated surface 158 of the light emitting device 150 can adhere to the surface 416 of the fluid 415.

Figure 13:
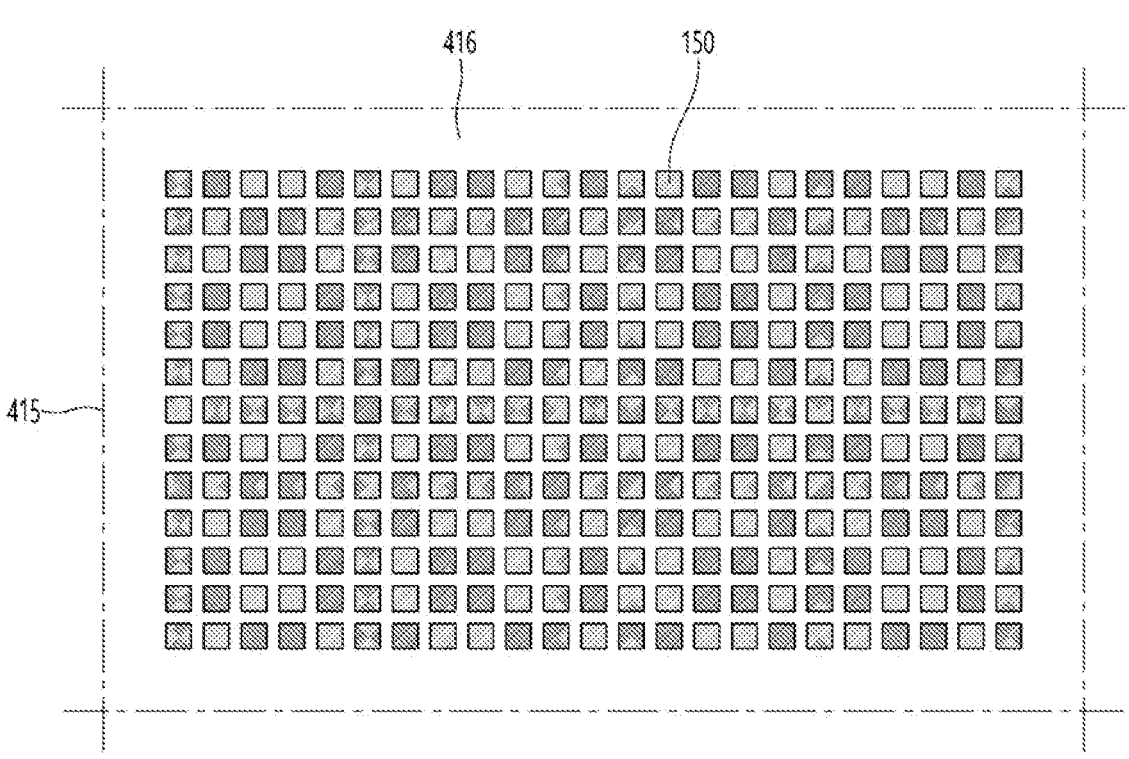
FIG. 13 is a plan view showing a state in which the light emitting device of an embodiment is dispersed on the surface of a fluid.

In the embodiment, when the plurality of light emitting devices 150 are dropped in the surface 416 of the fluid 415, the hydrophilic-treated surface 158 of each of the plurality of light emitting devices 150 on the surface 416 of the fluid 415 can be arranged to contact the surface 416 of fluid 415. In addition, the plurality of light emitting devices 150 dropped on the surface 416 of the fluid 415 can spread around the area where the light emitting devices 150 are dropped on the surface 416 of the fluid 415 as a center. Therefore, when the plurality of light emitting devices 150 are dropped on each of at least one or more regions of the surface 416 of the fluid 415, the plurality of light emitting devices 150 dropped on at least one or more regions can spread to the periphery, as shown in FIG. 13, the plurality of light emitting devices 150 can float on the entire area of the surface 416 of the fluid 415 at regular intervals. In the embodiment, the plurality of light emitting devices 150 can be spaced apart at regular intervals on the surface 416 of the fluid 415 so that collision between the light emitting devices 150 does not occur, thereby preventing breakage of the light emitting devices 150 and reducing defects of the light emitting device 150.

Although the hydrophobic-treated surface 157 is formed only on the upper surface of the metal layer 155 in the drawing, it can be formed on not only the upper surface of the metal layer 155 but also a side surface of each of the first conductivity type semiconductor layer 151, the active layer 152, the second conductivity type semiconductor layer 153 and the metal layer 155. In this case, the hydrophobic-treated surface 157 and the hydrophilic-treated surface 158 can be spaced apart from each other.

Although not shown in the drawing, a hydrophilic-treated surface 158 can be formed in the central region of a lower surface of the first conductivity type semiconductor layer 151 of the light emitting device 150, and a hydrophobic-treated surface 157 can be formed on an edge area excluding the central region. In addition, the hydrophobic-treated surface 157 can be formed not only on the upper surface of the metal layer 155 but also on the side surfaces of each of the first conductive semiconductor layer 151, the active layer 152, the second conductive semiconductor layer 153, and the metal layer 155.

Meanwhile, referring to FIG. 10, the self-assembly device 400 according to the embodiment can comprise a drop device 470.

The drop device 470 can comprise, for example, a dropper, but is not limited thereto.

A plurality of light emitting devices 150 can be filled in the dropper. For example, a plurality of light emitting devices 150 can be filled with liquid in the dropper. For example, the liquid can be a viscous liquid, but is not limited thereto. Although one dropper is shown in the drawing, a plurality of droppers can be provided so that a plurality of light emitting devices 150 can be simultaneously dropped from each of the plurality of droppers.

The drop device 470 can drop the plurality of light emitting devices 150 in at least one or more regions of the surface 416 of the fluid 415.

As an example, one drop device 470 can drop a plurality of light emitting devices 150 in at least one or more regions of the surface 416 of the fluid 415 while moving.

As another example, the plurality of light emitting devices 150 of each of the plurality of drop devices 470 can be dropped in a plurality of regions of the surface 416 of the fluid 415. Each of the plurality of drop devices 470 can drop the plurality of light emitting devices 150 sequentially or simultaneously.

Meanwhile, the self-assembly device 400 according to the embodiment can comprise a vibration generator 490.

The vibration generator 490 can generate vibration in the substrate 200 so that defective light emitting devices among the light emitting devices 150 assembled on the substrate 200 are detached from the substrate 200.

For example, the light emitting device 150 can be assembled into the assembly hole 203 of the substrate 200 by dielectrophoretic force formed in the substrate 200. At this time, since the light emitting devices 150 that are not inserted into the assembly hole 203 of the substrate 200 but attached near the assembly hole 203 of the substrate 200 or assembled in the wrong direction, that is, the defective light emitting devices do not emit light and do not contribute to the increase in luminance so that the defective light emitting devices 150 need to be recovered.

After the light emitting devices 150 are assembled in the assembly holes 203 of the substrate 200, vibration generated by the vibration generator 490 can be applied to the substrate 200. For example, the vibration generator 490 can be an ultrasonic vibration generator, but is not limited thereto. Since the substrate 200 is shaken by the vibration applied by the vibration generator 490, defective light emitting devices can be detached from the substrate 200 and returned to the surface 416 of the fluid 415. Since the defective light emitting devices returned to the surface 416 of the fluid 415 are recovered by the recovery device 480 described below, the waste of light emitting devices can be reduced and the manufacturing cost can be reduced.

Meanwhile, the self-assembly device 400 according to the embodiment can comprise a recovery device 480.

The recovery device 480 can recover the light emitting devices 150 floating on the surface 416 of the fluid 415 without being assembled on the substrate 200.

For example, the light emitting device 150 can be assembled into the assembly hole 203 of the substrate 200 by dielectrophoretic force formed in the substrate 200. Since the number of light emitting devices 150 floating on the surface 416 of the fluid 415 is greater than the number of assembly holes 203 of the substrate 200, the light emitting device 150 not assembled in the assembly hole 203 of the substrate 200 can float on the surface 416 of the fluid 415. The light emitting devices 150 floating on the surface 416 of the fluid 415 must be retrieved for use in the assembly of another substrate.

Figure 15:
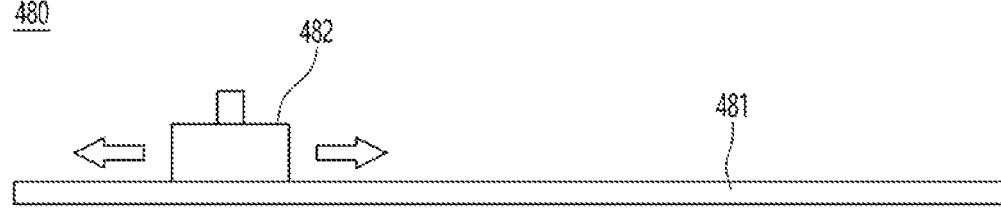
FIG. 15 illustrates a recovery device of FIG. 10.

As shown in FIG. 15, the recovery device 480 can comprise a support member 481 and at least one or more magnets 482.

When at least one or more magnets 482 are heavy, the magnets 482 can droop down. The support member 481 can support at least one or more magnets 482 to prevent the at least one or more magnets 482 from drooping downward.

When the at least one or more magnets 482 are light and do not droop down, the support member 481 can be omitted.

The support member 481 can have a size smaller than a size of the chamber 410, but is not limited thereto. The support member 481 can be transparent glass, but is not limited thereto. The support member 481 can be tempered glass so as not to break upon contact with the magnet 482.

The at least one or more magnets 482 can be a member for recovering the light emitting devices 150 floating on the surface 416 of the fluid 415.

The metal layer 155 of the light emitting device 150 shown in FIG. 11 can comprise a magnetic layer so that the light emitting devices 150 can be guided by the at least one or more magnets 482. That is, the metal layer 155 of the light emitting device 150 can comprise at least one or more metal layers, and one metal layer among the metal layers can be a magnetic layer. The magnetic layer can comprise, for example, Ni, but is not limited thereto.

Although not shown, the recovery device 480 can comprise a mesh having a transmission hole smaller than the size of the light emitting device 150, but is not limited thereto.

In the embodiment, after the self-assembly process for the substrate 200 is performed, the light emitting devices 150 floating on the surface 416 of the fluid 415 can be easily recovered so that the recovery rate can be increased and the manufacturing cost can be reduced.

Hereinafter, a self-assembly process according to an embodiment will be described with reference to FIGS. 16 to 24.

[Self-Assembly Process]

FIGS. 16 to 24 are views illustrating a self-assembly process according to an embodiment.

Figure 16:
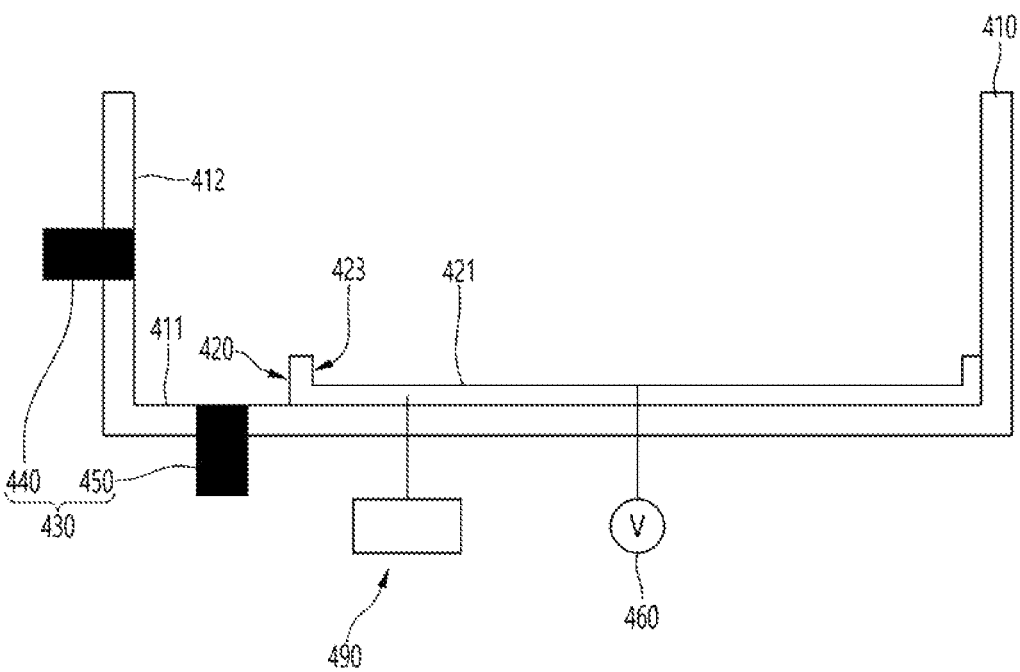
FIGS. 16 to 24 are views illustrating a self-assembly process according to an embodiment.

As shown in FIGS. 10 and 16, a self-assembly device 400 can be provided.

A mounting part 420 having a fixing groove 423 can be disposed on a lower side of the chamber 410.

Figure 17:
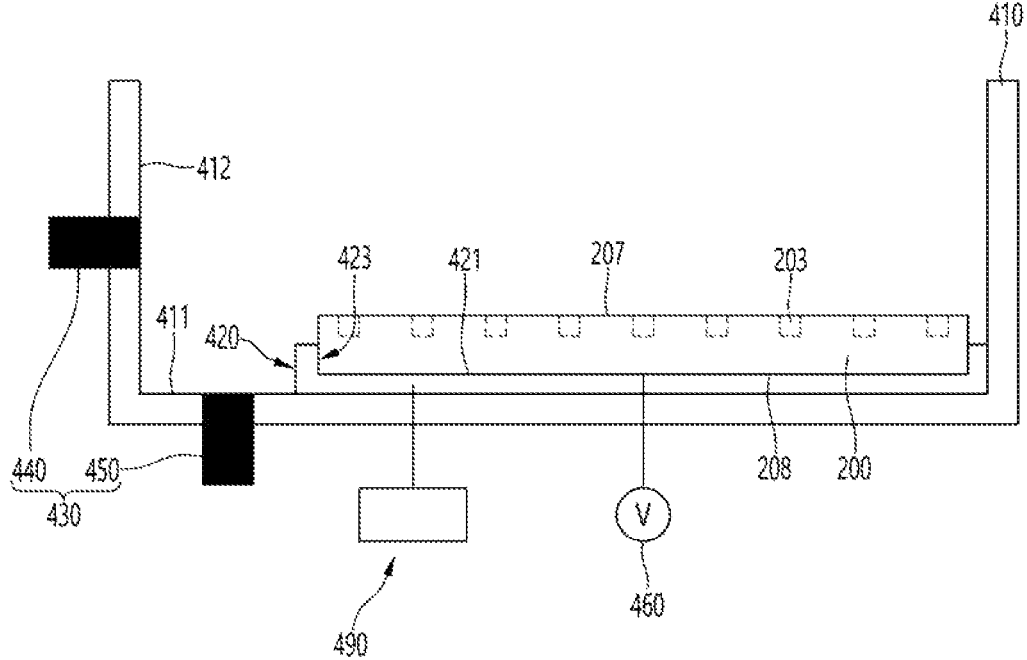

As shown in FIG. 17, a substrate 200 can be stocked. For example, the substrate 200 can be loaded into the self-assembly device 400 in a cassette, but is not limited thereto.

The substrate 200 can be mounted on a bottom portion 411 of the chamber 410. That is, the substrate 200 can be fixed to the fixing groove 423 of the mounting part 420. For example, the substrate 200 can be inserted into the fixing groove 423 of the mounting part 420. An inner surface of the fixing groove 423 is configured to come into contact with the side surface of the substrate 200 so that the substrate 200 can be fitted and fixed into the fixing groove 423, but is not limited thereto. Although not shown, at least one or more fixing parts capable of fixing the substrate 200 can be installed around the fixing groove 423. The substrate 200 inserted into the fixing groove 423 can be fixed by the fixing part. The substrate 200 inserted into the fixing groove 423 can be released by unlocking the fixing part.

The bottom portion 421 of the fixing groove 423 can have a flat surface as shown in FIG. 14. In this case, since a lower surface of the substrate 200 fixed to the fixing groove 423 is in contact with the bottom portion 421 of the fixing groove 423, warpage does not occur in the substrate 200. As will be described later, since the self-assembly process is performed in a state where the substrate 200 is not warped, a uniform number of light emitting devices 150 can be assembled to each pixel of the substrate 200 to ensure uniform luminance, and more light emitting devices 150 can be assembled to each pixel of the substrate 200 to ensure high luminance.

Figure 18:
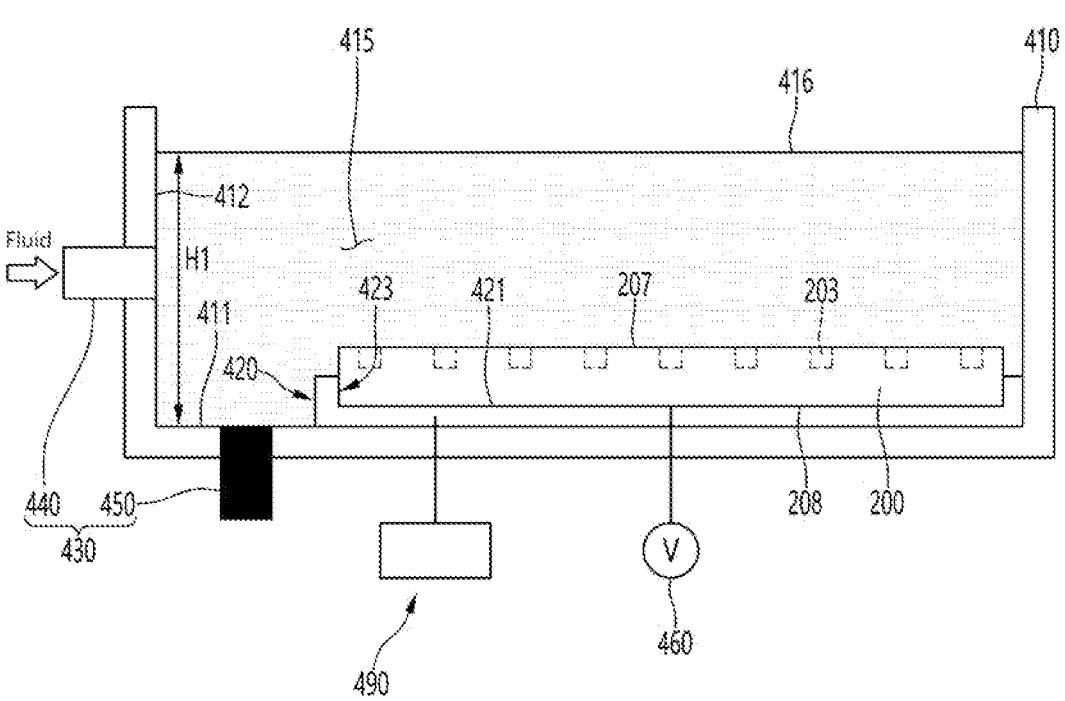

As shown in FIG. 18, fluid 415 can be filled in the chamber 410 by a fluid level adjuster 430. That is, the fluid 415 is supplied into the chamber 410 by opening the opening of a fluid supply source 440, and the fluid 415 in the chamber 410 is not exhausted to the outside by blocking the opening of a fluid exhauster 450. Accordingly, the fluid 415 in the chamber 410 can be filled to a first height H1. The first height H1 can be higher than an upper surface of the substrate 200 mounted on the mounting part 420, that is, a assembly surface 207. Here, the first height H1 can be a height from a bottom portion 411 of the chamber 410.

Since a surface 416 of the fluid 415 is positioned higher as the first height H1 is higher, as will be described later, the light emitting devices 150 can be easily dropped in the surface 416 of the fluid 415. The first height H1 can be located near the upper side of the chamber 410, but is not limited thereto.

Figure 19:
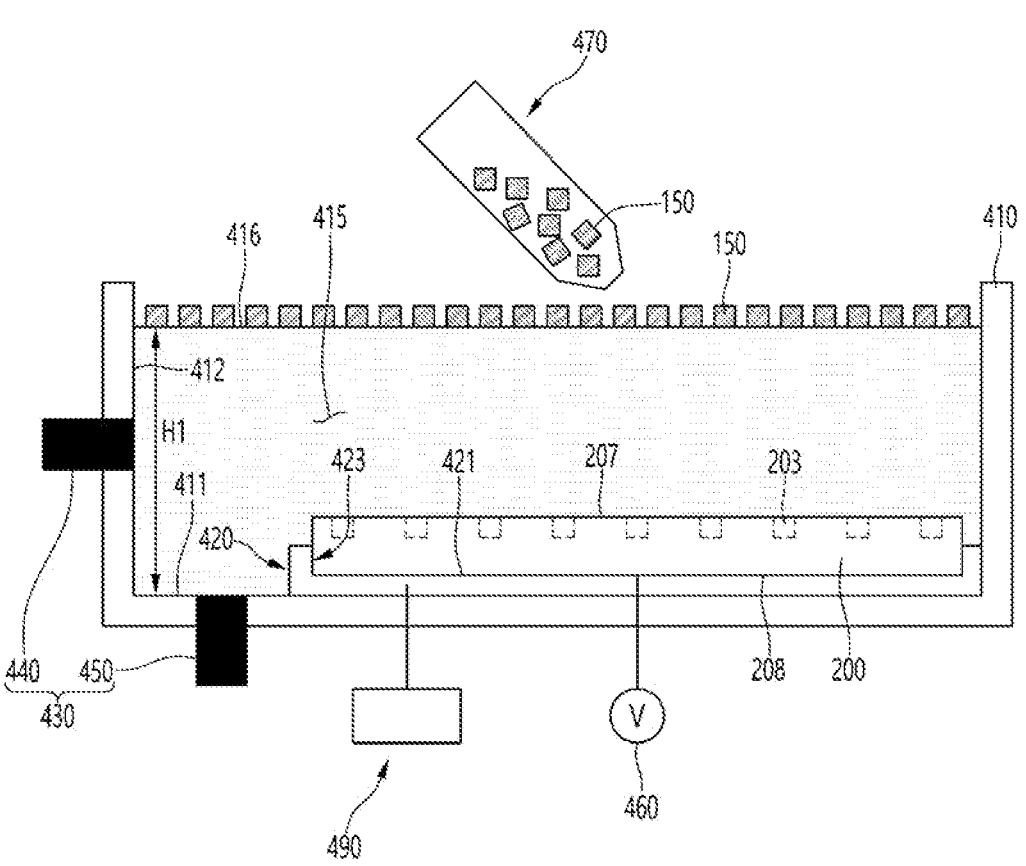

As shown in FIG. 19, a plurality of light emitting devices 150 can be floated on the surface 416 of the fluid 415 using the drop device 470.

The plurality of light emitting devices 150 can be included in the drop device 470. The drop device 470 can drop the fluid 415 in at least one or more regions of the surface 416. The plurality of light emitting devices 150 dropped on at least one or more regions of the surface 416 of the fluid 415 can spread around, and the plurality of light emitting devices 150 can float on the entire area of the surface 416 of the fluid 415 at regular intervals. Since the gravity of the light emitting device 150 is smaller than the gravity of the fluid 415 and the light emitting device 150 can be light in size in micro units or nano units, the plurality of light emitting devices 150 dropped on the surface 416 of the fluid 415 can float on the surface 416 of the fluid 415 without sinking in the fluid 415.

Meanwhile, each of the plurality of light emitting devices 150 can have a hydrophobic-treated surface 157 on one surface thereof, as shown in FIG. 11. Therefore, when the plurality of light emitting devices 150 are dropped on the surface 416 of the fluid 415 by the drop device 470, the hydrophobic-treated surface 157 of each of the plurality of light emitting devices 150 can be positioned to face the opposite side of the surface 416 of the fluid 415, that is, upward. When the hydrophobic-treated surface 157 of the light emitting device 150 faces the surface 416 of the fluid 415, the hydrophobic-treated surface 157 of the light emitting device 150 can generate a repelling force against the surface 416 of the fluid 415. Thus, the light emitting device 150 can be turned over so that the hydrophobic-treated surface 157 of the light emitting device 150 faces upward. Therefore, since the light emitting device 150 floats on the surface 416 of the fluid 415 in a state where the assembly directionality of the light emitting device 150 is adjusted. As will be described later, during self-assembly, the light emitting device 150 can be assembled without defects in the assembly hole 203 of the substrate 200, and assembly accuracy and assembly speed can be improved at the same time.

Figure 20:
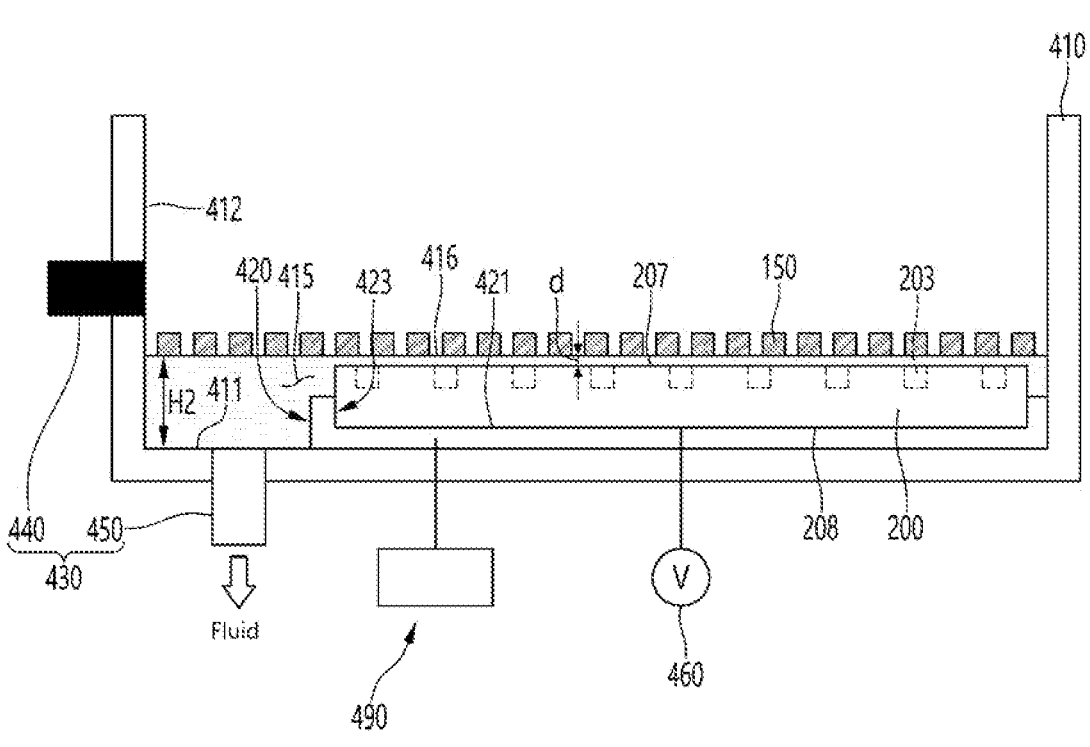

As shown in FIG. 20, the height of the fluid 415 in the chamber 410 is reduced from the first height H1 to the second height H2 by the fluid level adjuster 430, the plurality of light emitting devices 150 floating on the surface 416 of the fluid 415 can be proximate to the assembly surface 207 of the substrate 200. This is to ensure that the plurality of light emitting devices 150 are more easily and accurately assembled into the assembly holes 203 of the substrate 200.

For example, the opening of the fluid supply source 440 is blocked and the opening of the fluid exhauster 450 is opened so that the fluid 415 in the chamber 410 can be exhausted to the outside to reduce the height of the fluid 415 in the chamber 410. For example, when the height of the fluid 415 reaches the second height H2, the opening of the fluid exhauster 450 is blocked so that the fluid 415 in the chamber 410 is no longer exhausted to the outside and can be maintained at the second height H2. Here, the second height H2 can be a height from the bottom portion 411 of the chamber 410.

The second height H2 of the fluid 415 can be at least higher than the assembly surface 207 of the substrate 200. For example, the distance d between the surface 416 of the fluid 415 and the assembly surface 207 of the substrate 200 can be the distance affected by the dielectrophoretic force formed on the substrate 200.

Therefore, the plurality of light emitting devices 150 can be positioned near the assembly surface 207 of the substrate 200 so that the plurality of light emitting devices 150 can be easily, accurately and quickly assembled into the assembly hole 203 of the substrate 200 by the dielectrophoretic force formed in the substrate 200.

In addition, the plurality of light emitting devices 150 can uniformly be distributed over the entire area of the surface 416 of the fluid 415, and the entire area of the surface 416 of the fluid 415 can be spaced the same distance d from the assembly surface 207 of the substrate 200. Accordingly, a uniform number of light emitting devices 150 can be assembled to each pixel of the substrate 200 to ensure a uniform luminance for each pixel. In addition, by assembling more light emitting devices 150 in each pixel to secure high luminance, a display device having a large area and high luminance can be implemented.

Figure 21:
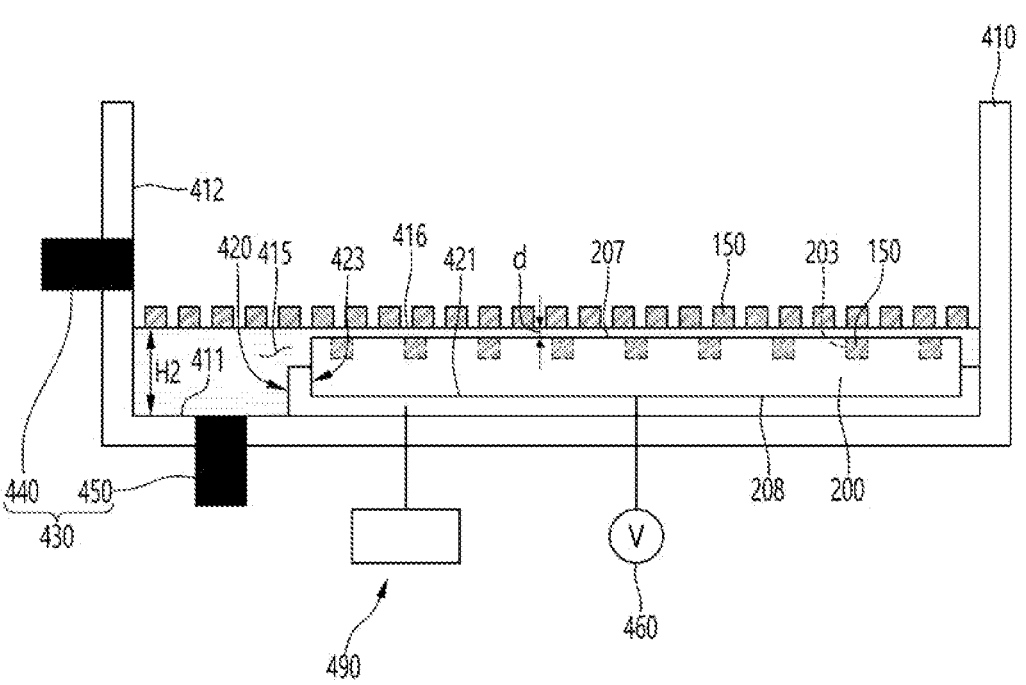

As shown in FIG. 21, a dielectrophoretic force can be formed on the substrate 200 by applying a voltage to the voltage supplier 460. The plurality of light emitting devices 150 located near the assembly surface 207 of the substrate 200 can be assembled into the assembly hole 203 of the substrate 200 by the dielectrophoretic force.

Since the bottom portion (421 in FIG. 14) of the fixing groove 423 of the mounting part 420 has a flat surface, when the substrate 200 is fixed to the fixing groove 423 of the mounting part 420, warpage does not occur in the substrate 200. In addition, the surface 416 of the fluid 415 having the second height H2 has a horizontal plane, so that the entire area of the surface 416 of the fluid 415 can have a uniform distance d with respect to the entire area of the assembly surface 207 of the substrate 200. Therefore, the plurality of light emitting devices 150 floating on the surface 416 of the fluid 415 can be more accurately and more quickly assembled into the assembly hole 203 of the substrate 200 so that assembly accuracy and assembly speed can be simultaneously improved.

Each of the plurality of light emitting devices 150 floating on the surface 416 of the fluid 415 has a hydrophobic-treated surface 157 on one surface thereof and can be positioned on the surface 416 of the fluid 415 with an assembly directionality. That is, each of the plurality of light emitting devices 150 can be positioned such that the first conductivity type semiconductor layer 151 of the light emitting device 150 faces downward. In addition, the plurality of light emitting devices 150 can be positioned on the surface 416 of the fluid 415 having the second height H2 and can be positioned near the assembly surface 207 of the substrate 200. Therefore, the plurality of light emitting devices 150 positioned on the surface 416 of the fluid 415 to have assembly directionality by the dielectrophoretic force formed on the substrate 200 can be assembled through the assembly holes of the substrate 200 while maintaining the assembly directionality. That is, the lower side of the first conductivity type semiconductor layer 151 of the light emitting device 150 can contact the bottom surface of the assembly hole 203 of the substrate 200. When the light emitting device 150 is assembled to the substrate 200 such that the lower side of the first conductivity type semiconductor layer 151 of the light emitting device 150 is in contact with the bottom surface of the assembly hole 203 of the substrate 200, the corresponding light emitting device 150 can be a normal light emitting device capable of emitting light. Therefore, according to the embodiment, since the number of light emitting devices 150 assembled on the substrate 200 as normal light emitting devices is increased, the luminance is improved and the manufacturing cost can be significantly reduced by minimizing the number of the defective light emitting devices.

On the other hand, when the light emitting devices 150 are assembled to the substrate 200, some light emitting devices 150 cannot be inserted into the assembly hole 203 of the substrate 200 and can be attached near the assembly hole 203 of the substrate 200 or inserted into the assembly hole 203 in the wrong direction. These light emitting devices 150 need to be recovered as defective light emitting devices that cannot emit light.

To this end, the vibration generated by the vibration generator 490 is applied to the substrate 200 so that the defective light emitting device can be detached from the substrate 200. The defective light emitting devices detached from the substrate 200 can float to the surface 416 of the fluid 415 and float on the surface 416 of the fluid 415. Therefore, light emitting devices not assembled in the assembly hole 203 of the substrate 200 or detached from the substrate 200 can float on the surface 416 of the fluid 415.

Figure 22:
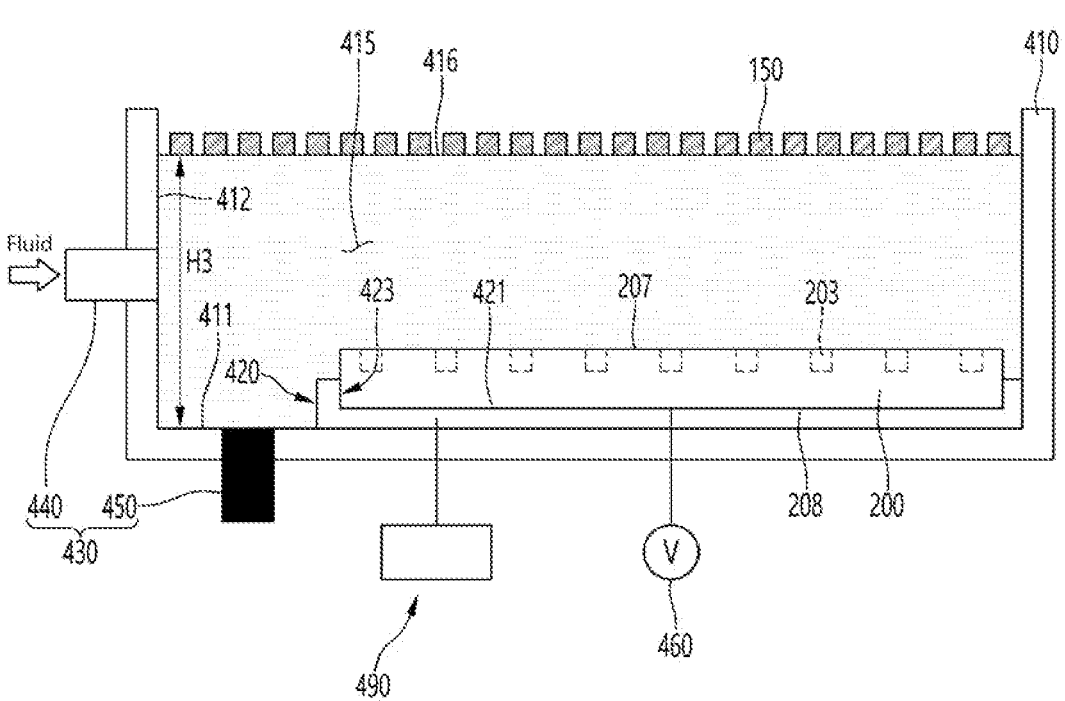

As shown in FIG. 22, the height of the fluid 415 in the chamber 410 can be increased by the fluid level adjuster 430. That is, the opening of the fluid supply source 440 can be opened and the opening of the fluid exhauster 450 can be blocked. The fluid 415 can be supplied to the chamber 410 through the opening of the fluid supply source 440 so that the height of the fluid 415 can increase from the second height H2 to the third height H3. For example, the third height H3 can be determined between the first height H1 and the second height H2.

When the height of the fluid 415 reaches the third height H3, the opening of the fluid supply source 440 can be blocked.

Figure 23:
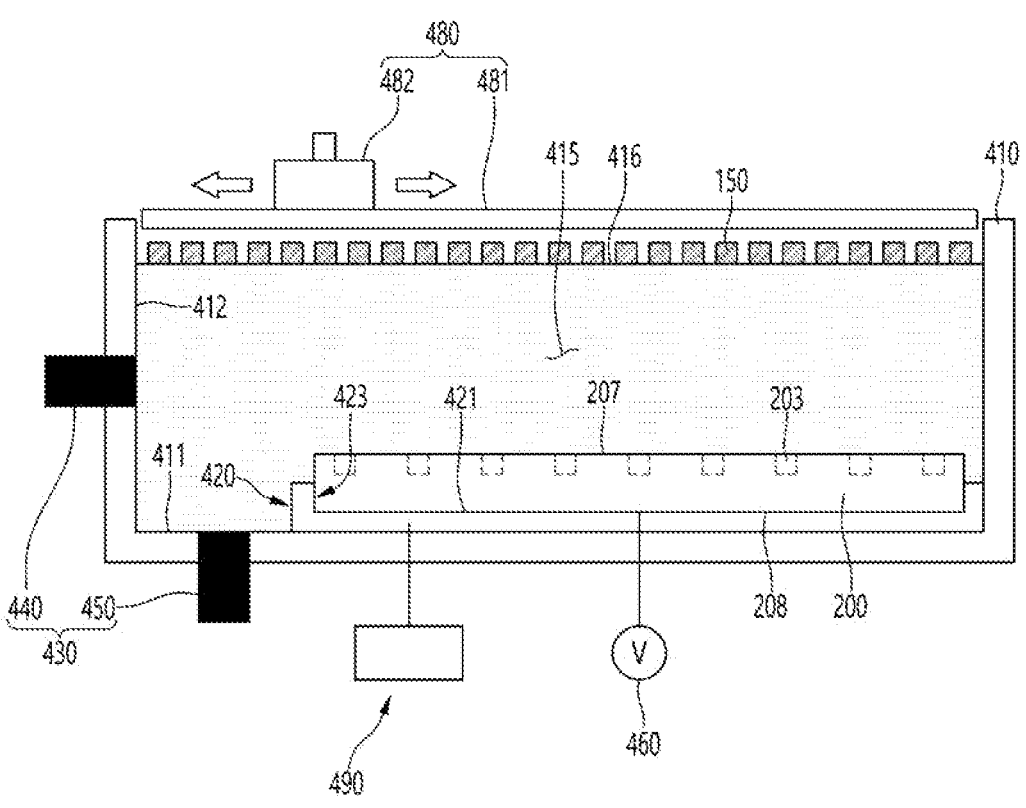

As shown in FIG. 23, the light emitting device 150 floating on the surface 416 of the fluid 415 can be recovered using the recovery device 480. That is, since at least one or more magnets 482 of the recovery device 480 is located on the surface 416 of the fluid 415 and moves in the horizontal direction, the light emitting device 150 floating on the surface 416 of the fluid 415 can be induced to magnets 482. In this way, by collecting the light emitting device 150 guided by at least one or more magnets 482, the light emitting device 150 can be reused, thereby reducing the manufacturing cost.

A support member 481 can be disposed below at least one or more magnets 482 to prevent the magnets 482 from drooping downward due to the weight of the magnets 482.

Figure 24:
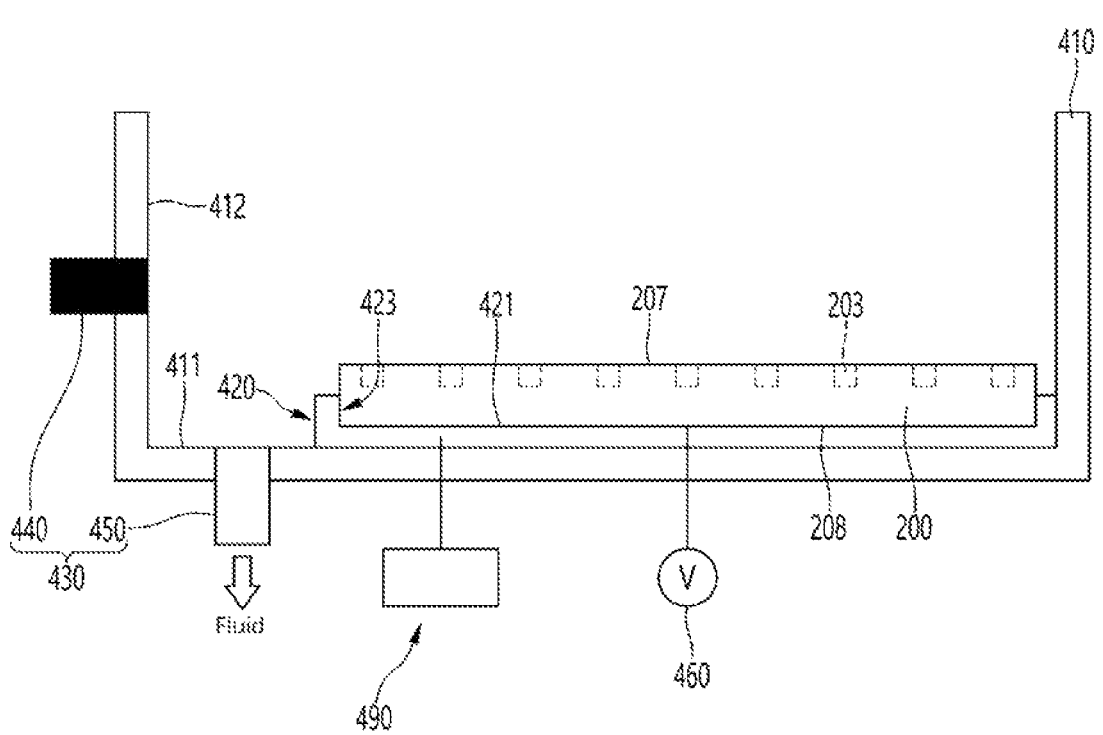

As shown in FIG. 24, the fluid 415 in the chamber 410 can be exhausted by the fluid level adjuster 430. That is, the opening of the fluid supply source 440 can be blocked and the opening of the fluid exhauster 450 can be opened so that the fluid 415 in the chamber 410 can be exhausted to the outside.

The fluid 415 in the chamber 410 can be exhausted to take out the substrate 200 in the chamber 410. For example, all of the fluid 415 in the chamber 410 can be evacuated. For example, some of the fluid 415 in the chamber 410 can remain. At this time, the height of the fluid 415 in the chamber 410 can be lower than the upper surface of the fixing groove 423 of the mounting part 420.

When there is no problem in taking the substrate 200 out of the chamber 410 while the fluid 415 in the chamber 410 is maintained at the third height H3, the fluid 415 in the chamber 410 may not be exhausted.

An electrophoretic force can be formed on the substrate 200 until the substrate 200 is taken out of the chamber 410. That is, as the electrophoretic force is continuously formed on the substrate 200 during the process shown in FIGS. 21 to 23, the light emitting device 150 assembled in the assembly hole 203 of the substrate 200 can be continuously fixed to the assembly hole 203 of the substrate 200.

A display device can be manufactured from the substrate 200 taken out of the chamber 410 through a post-process, and a plurality of light emitting devices 150 constituting the display device emit light according to an electrical signal applied to the display device to display a color image.

A self-assembly process of assembling the light emitting device 150 on the substrate 200 can be performed by the processes shown in FIGS. 16 to 24.

The above detailed description should not be construed as limiting in all respects and should be considered illustrative. The scope of the embodiment should be determined by reasonable interpretation of the appended claims, and all changes within the equivalent range of the embodiment are included in the scope of the embodiment.

INDUSTRIAL APPLICABILITY

The embodiment can be adopted in the display field for displaying images or information.

The invention claimed is:

1. A self-assembly device, comprising:
a chamber configured to accommodate a fluid in which a plurality of light emitting devices are floated on a surface thereof, the fluid having a first height;
a mounting part disposed on a bottom portion of the chamber to mount a substrate;
a fluid level adjuster configured to adjust a height of the fluid; and
a voltage supplier configured to apply a voltage to the substrate to assemble the floated plurality of light emitting devices when the height of the fluid decreases from the first height to a second height.

2. The self-assembly device of claim 1, wherein one surface of each of the plurality of floating light emitting devices has a hydrophobic-treated surface to have a assembly directionality.

3. The self-assembly device of claim 2, wherein an opposite surface opposite to the one surface has a hydrophilic-treated surface.

4. The self-assembly device of claim 2, wherein the plurality of light emitting devices comprises a drop device configured to drop on at least one or more regions of the surface of the fluid.

5. The self-assembly device of claim 1, wherein the mounting part has a fixing groove to have a size corresponding to a size of the substrate for fixing the substrate.

6. The self-assembly device of claim 5, wherein the fixing groove comprises a bottom portion having a flat surface, and
wherein the substrate is configured to contact the bottom portion of the fixing groove.

7. The self-assembly device of claim 1, wherein the fluid level adjuster comprises:
at least one or more fluid supply sources configured to supply the fluid into the chamber; and
at least one or more fluid exhausters configured to exhaust the fluid in the chamber.

8. The self-assembly device of claim 7, wherein the at least one or more fluid supply sources are installed on a side portion of the chamber, and
wherein the at least one or more fluid exhausters are installed on a bottom portion of the chamber.

9. The self-assembly device of claim 1, further comprising:
a recovery device configured to recover light emitting devices floating on the surface of the fluid without being assembled on the substrate.

10. The self-assembly device of claim 9, wherein the recovery device comprises:
a support member on the fluid having a third height; and
at least one or more magnets on the support member.

11. The self-assembly device of claim 1, further comprising:
a vibration generator configured to generate the vibration in the substrate so that defect light emitting devices among the light emitting devices assembled on the substrate are detached from the substrate.

* * * * *